United States Patent
Ogane et al.

(10) Patent No.: US 9,416,220 B2
(45) Date of Patent: Aug. 16, 2016

(54) RESIN COMPOSITION FOR OPTICAL STEREOLITHOGRAPHY

(71) Applicant: CMET, Inc., Yokohama-Shi (JP)

(72) Inventors: Nobuo Ogane, Yokohama (JP); Yuya Daicho, Yokohama (JP); Eiji Nakamoto, Yokohama (JP); Chiharu Homma, Yokohama (JP)

(73) Assignee: CMET Inc., Yokohama-Shi (JP)

( * ) Notice: Subject to any disclaimer, the term of this patent is extended or adjusted under 35 U.S.C. 154(b) by 0 days.

(21) Appl. No.: 14/401,963

(22) PCT Filed: May 16, 2013

(86) PCT No.: PCT/JP2013/063643
§ 371 (c)(1),
(2) Date: Nov. 18, 2014

(87) PCT Pub. No.: WO2013/172407
PCT Pub. Date: Nov. 21, 2013

(65) Prior Publication Data
US 2015/0158971 A1 Jun. 11, 2015

(30) Foreign Application Priority Data

May 18, 2012 (JP) ................................. 2012-114896

(51) Int. Cl.
| | | |
|---|---|---|
| B29C 67/00 | (2006.01) | |
| B29C 67/24 | (2006.01) | |
| C08G 59/68 | (2006.01) | |
| C08K 5/37 | (2006.01) | |
| C08G 59/24 | (2006.01) | |
| C08G 65/18 | (2006.01) | |
| C08G 59/38 | (2006.01) | |
| C09D 163/00 | (2006.01) | |
| G03F 7/00 | (2006.01) | |
| G03F 7/004 | (2006.01) | |
| G03F 7/038 | (2006.01) | |
| C08L 63/00 | (2006.01) | |

(52) U.S. Cl.
CPC .............. *C08G 59/245* (2013.01); *B29C 67/00* (2013.01); *C08G 59/24* (2013.01); *C08G 59/38* (2013.01); *C08G 65/18* (2013.01); *C09D 163/00* (2013.01); *G03F 7/0037* (2013.01); *G03F 7/0045* (2013.01); *G03F 7/0046* (2013.01); *G03F 7/038* (2013.01)

(58) Field of Classification Search
None
See application file for complete search history.

(56) References Cited

U.S. PATENT DOCUMENTS

| | | |
|---|---|---|
| 4,069,055 A | 1/1978 | Crivello |
| 6,368,769 B1 | 4/2002 | Ohkawa et al. |
| 2010/0304100 A1* | 12/2010 | Fong ............... G03F 7/0037 428/205 |
| 2010/0327493 A1* | 12/2010 | Fong ............... C07C 381/12 264/401 |
| 2013/0116362 A1* | 5/2013 | Yamazaki ............. C08F 2/44 523/458 |

FOREIGN PATENT DOCUMENTS

| | | |
|---|---|---|
| EP | 1 036 789 A1 | 9/2000 |
| GB | 1 516 351 A | 7/1978 |
| GB | 1 516 511 A | 7/1978 |
| JP | 52-014279 B2 | 1/1977 |
| JP | 52-014277 B2 | 4/1977 |
| JP | 52-014278 B2 | 4/1977 |
| JP | 2007-238828 A1 | 9/2007 |
| JP | 2007-262401 A1 | 10/2007 |
| JP | 2010-265408 A1 | 11/2010 |
| JP | 2011-089088 A1 | 5/2011 |
| WO | 2008/127930 A1 | 10/2008 |
| WO | 2009/070500 A1 | 6/2009 |
| WO | WO 2011/053133 A1 * | 5/2011 ............. C08J 3/24 |
| WO | 2011/102286 A1 | 8/2011 |
| WO | WO 2011/162293 A1 * | 12/2011 ............. C08L 33/08 |

OTHER PUBLICATIONS

Machine translation of CN 102762660 A (no date).*
International Preliminary Report on Patentability (Application No. PCT/JP2013/063643) dated Nov. 27, 2014.
International Search Report (Application No. PCT/JP2013/063643) dated Aug. 13, 2013.
European Office Action, European Application No. 13791488.3, dated Dec. 17, 2015 (7 pages).

* cited by examiner

*Primary Examiner* — Michael J Feely
(74) *Attorney, Agent, or Firm* — Burr & Brown, PLLC

(57) ABSTRACT

A resin composition for optical stereolithography including a cation-polymerizable organic compound (A), a radical polymerizable organic compound (B), a cationic polymerization initiator (C) and a radical polymerization initiator (D), wherein the cationic polymerization initiator (C) is an aromatic sulfonium compound (C-1) represented by the following general formula (C-1):

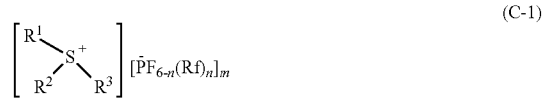

(C-1)

wherein $R^1$, $R^2$, and $R^3$ represent a monovalent organic group, Rf represents a fluoroalkyl group, m is the same number as the cationic charge of the "cation $[S^+(R^1)(R^2)(R^3)]$", and n is an integer in a range of 0 to 6. The resin composition also includes an aromatic thiol compound (E) represented by the following general formula (E):

$$R^4\!\!-\!\!(SH)_p \qquad (E)$$

wherein, $R^4$ represents a mono- or di-valent aromatic hydrocarbon which may optionally have a substituent, and p is an integer of 1 or 2.

7 Claims, No Drawings

RESIN COMPOSITION FOR OPTICAL STEREOLITHOGRAPHY

BACKGROUND OF THE INVENTION

1. Field of the Invention

The present invention relates to a resin composition for optical stereolithography, and a method for producing an optical stereolithographic product using the composition. More particularly, the invention relates to a composition for optical stereolithography containing a non-antimony-based cationic polymerization initiator which is excellent in safety and free from environmental pollution. Using a resin composition for optical stereolithography according to the present invention can safely and productively produce an optical stereolithographic product at a high stereographic speed, thus a product, which has low yellowness, high whole light transmittance, and color tone equivalent to or close to colorless transparency, and also exhibits excellent heat resistance, toughness, other mechanical properties, water resistance and the like, can be obtained at high curing sensitivity while preventing geoenvironmental pollution.

2. Description of Related Art

Various resin compositions for optical stereolithography have hitherto been proposed, for example, a composition containing a cation-polymerizable organic compound and a cationic polymerization initiator; a composition containing a radical polymerizable organic compound and a radical polymerization initiator; a composition containing a cation-polymerizable organic compound, a radical polymerizable organic compound, a cationic polymerization initiator and a radical polymerization initiator, or the like.

Among them in a resin composition for optical stereolithography containing a cation-polymerizable organic compound such as an epoxy compound, a cationic polymerization initiator existing in a system generates upon illumination cationic species ($H^+$) which reacts with a cation-polymerizable organic compound such as an epoxy compound in a chain reaction, resulting in ring-opening of the cation-polymerizable organic compound, thus the reaction proceeds. Using a photo-curable resin composition based on a cation-polymerizable organic compound such as an epoxy compound generally results in a photo-cured product having better dimensional accuracy with little contraction, compared with those obtained using a photo-curable resin composition based on a radical polymerizable organic compound.

As a cationic polymerization initiator for photopolymerization of a cation-polymerizable organic compound, a cationic photopolymerization initiator is known, which initiator consists of an aromatic sulfonium salt of an element in group VIIa (see, patent Literature 1), an aromatic onium salt of an element in group VIa (see, patent Literature 2), an aromatic onium salt of an element in group Va (see, patent Literature 3), and the like. In a photo-curable resin composition containing a cation-polymerizable organic compound, a sulfonium salt containing antimony has been widely used as a cationic photopolymerization initiator.

However, an antimony compound requires extreme care for handling, because it is generally toxic and shows toxic effect like arsenic and mercury, and further has concerns about working- and global-environmental pollution.

In this regard, a resin composition for optical stereolithography has been proposed, which utilizes a cationic polymerization initiator consisting of a sulfonium salt containing phosphorous, instead of the conventionally widely used antimony-based cationic polymerization initiator (see, Patent Literatures 4, 5, 6).

However, when illuminated, a cationic polymerization initiator consisting of a sulfonium salt containing phosphorous generates an acid (cationic species) having lower acidity, compared with that obtained from an antimony-based cationic polymerization initiator, thus it has low catalytic activity as a cation polymerization initiator upon illumination, and often fails to provide a stereolithographic product with sufficient physical properties.

Under such circumstances, among phosphorous-based cationic polymerization initiators consisting of phosphorous-containing sulfonim salts, a phosphorous-based cationic polymerization initiator wherein an anionic part consists of a phosphate having a fluoroalkyl group is known to have an ability to initiate photopolymerization equivalent to those of the conventional antimony-based cationic polymerization initiator. However, when a phosphorous-based cationic polymerization initiator wherein an anionic part consist of a phosphate having a fluoroalkyl group is used to prepare a resin composition for optical stereolithography, and the resin composition for optical stereolithography is used to conduct optical stereolithography, the resulting stereolithographic product turns to pale yellow and a stereolithographic product has a color tone equivalent to or close to colorless transparency cannot be obtained. In particular, when a phosphorous-based sulfonium salt wherein an anionic part is a trifluorotris (fluoroalkyl)phosphate ion represented by the formula: $[PF_3(Rf)_3^-]$, wherein Rf is a fluoroalkyl, is used as a cationic polymerization initiator, the resulting stereolithographic product has problem of having enhanced yellowness and becomes gradually darker color when allowed to stand at room temperature.

A stereolithographic product obtained by optical stereolithography using a resin composition for optical stereolithography has been widely used, for example, as a model for validation of an appearance of various kinds of industrial products in designing them, a model to check the functionality of a component, a resin mold to form a casting mold, a base model to form a metal mold. Recently, there exists a need for a model having high transparency and free from yellowing such as a lens for an automobile or motorbike. Such a composition has also been utilized in the field of fine arts and crafts, for example, for restoration or simulation of art works, for contemporary art, as a presentation model for a design of a building covered with glass. Accordingly, as for a resin composition for optical stereolithography which contains phosphorous-based cation polymerization initiator excellent in safety, it is also required to produce a stereolithographic product having high transparency without yellowing.

PATENT LITERATURE

Patent Literature 1: Japanese Patent Publication No. S52-4277

Patent Literature 2: Japanese Patent Publication No. S52-4278

Patent Literature 3: Japanese Patent Publication No. S52-14279

Patent Literature 4: Japanese Patent Application Laid-Open No. 2007-262401

Patent Literature 5: Japanese Patent Application Laid-Open No. 2007-238828

Patent Literature 6. Japanese Patent Application Laid-Open No 2011-89088

SUMMARY OF THE INVENTION

Technical Problem

An object of the present invention is to provide a resin composition for optical stereolithography which contains, no toxic antimony-based cationic polymerization initiator as a cationic polymerization initiator, thereby producing a stereolithographic product excellent in safety and handling properties, and exhibiting excellent appearance equivalent to or close to colorless transparency without being yellowed.

Also, an object of the invention is to provide a resin composition for optical stereolithography enabling production of a stereolithographic product which is excellent in toughness, durable, less brittle, and exhibits excellent heat resistance due to its higher heat deflection temperature, in addition to having the above characteristics such as safety, colorless transparency, and further having high sensitivity to photo-curing, thereby productively producing a stereolithographic product in a shorter period for optical stereolithography, which product further exhibits excellent dimension accuracy, other mechanical properties, heat resistance and the like.

Solution to Problem

The present inventors have studied intensively to attain the above object. As the result, we have found that, a resin composition for optical stereolithography containing a cation-polymerizable organic compound, a radical polymerizable organic compound, a cationic polymerization initiator, and a radical polymerization initiator, wherein a phosphorous-based aromatic sulfonium salt is used as a cation polymerization initiator and an aromatic thiol compound is contained therein, produces a stereolithographic product which has good color tone with low yellowness and good color tone equivalent to or close to colorless transparency as well as good appearance while exhibiting as high catalytic activity as that exhibited by using an antimony-based cationic polymerization initiator.

The inventors have also found that a stereolithographic product can be obtained which has lower yellowness, improved properties, that is colorless transparency, when at least one dye selected from purple and blue dyes is further contained in the above resin composition for optical stereolithography.

The inventors have also found that the above resin composition for optical stereolithography, when it contains an oxetane compound as a pert of the cation-polymerizable organic compound, results in a resin composition for optical stereolithography which provides a stereolithographic product having high sensitivity for photo-curing and excellent color tone, mechanical properties, heat resistance and the like. We have attained the invention based on these findings.

That is, the present invention is:

(1) a resin composition for optical stereolithography containing a cation-polymerizable organic compound (A), a radical polymerizable organic compound (B), cationic polymerization initiator (C), and a radical polymerization initiator (D);

which contains, as a cationic polymerization initiator (C), an aromatic sulfonium compound (C-1) represented by the following general formula (C-1):

(C-1)

[in the above general formula (C-1), $R^1$, $R^2$, and $R^3$ each represent a monovalent organic group, Rf represents a fluoroalkyl group, m is the same number as the cationic charge of the "cation $[S^+(R^1)(R^2)(R^3)]$", n is an integer in the range of 0-6.]

and further contains an aromatic thiol compound (E) represented by the following general formula (E):

(E)

(wherein, $R^4$ represent a mono- or di-valent aromatic hydrocarbon which may optionally have a substituent, p is an integer of 1 or 2.)

The present invention is a resin composition for optical stereolithography according to the above (1), wherein (2) a content of the aromatic thiol compound (E) is in the range of 0.1~5 mass % based on the mass of the aromatic sulfonium compound (C-1).

Moreover, the present invention is:

(3) a resin composition for optical stereolithography according to the above (1) or (2), wherein $R^1$, $R^2$, and $R^3$ in the above general formula (C-1) each independently represents a monovalent aromatic group which may optionally have a substituent on the aromatic ring and have one or two or more bond represented by formulae: —S—, —SO—, —O—, and —C—;

(4) a resin composition for optical stereolithography according to any one of the above (1) to (3), wherein $R^1$, $R^2$, and $R^3$ in the above general formula (C-1) each independently represents a group represented by the following general formulae <1> to <11>,

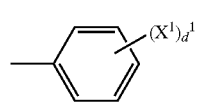

(1)

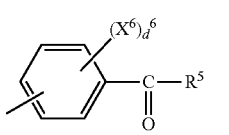

(2)

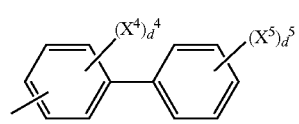

(3)

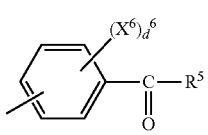

(4)

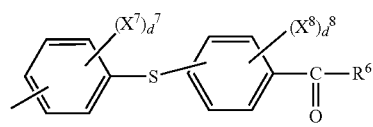

(5)

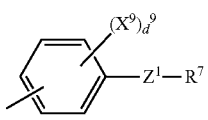

(6)

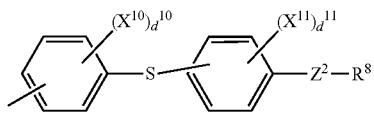 (7)

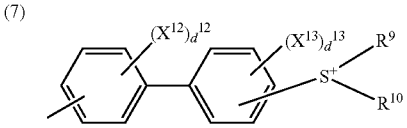 (8)

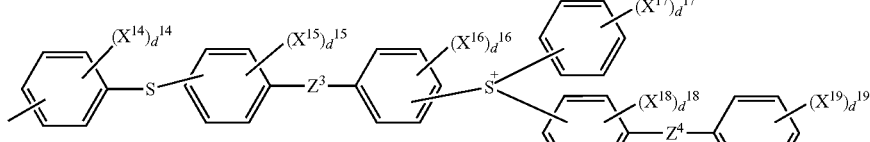 (9)

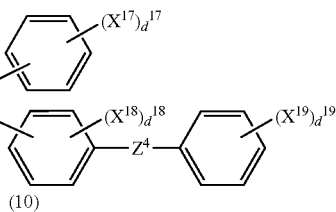

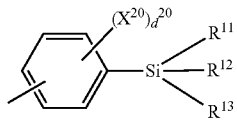 (10)

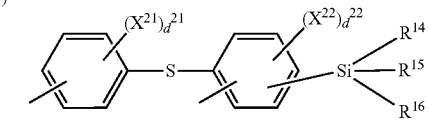 (11)

[wherein $R^5$, $R^6$, $R^7$, $R^8$, $R^9$, $R^{10}$, $R^{11}$, $R^{12}$, $R^{13}$, $R^{14}$, $R^{15}$, and $R^{16}$ each independently represent an alkyl or aryl group which may have a substituent group, $X^1$, $X^2$, $X^3$, $X^4$, $X^5$, $X^6$, $X^7$, $X^8$, $X^9$, $X^{10}$, $X^{11}$, $X^{12}$, $X^{13}$, $X^{14}$, $X^{15}$, $X^{16}$, $X^{17}$, $X^{18}$, $X^{19}$, $X^{20}$, $X^{21}$, and $X^{22}$ each independently represent a group selected from an alkyl group, an aryl group, an alkoxy group, an aryloxy group, a hydroxy(poly)alkyleneoxy group, a hydroxyl group, a cyano group, a nitro group, and a halogen atom; $Z^1$, $Z^2$, $Z^3$, and $Z^4$, each independently represents a divalent group selected from formula; —S—, —SO—, and —O—, $d^1$ independently represents an integer in the range of 0 to 5; $d^2$, $d^3$, and $d^4$ each independently represents an integer in the range of 0 to 4; $d^5$ independently represents an integer in the range of 0 to 5; $d^6$, $d^7$, $d^8$, $d^9$, $d^{10}$, $d^{11}$, $d^{12}$, $d^{13}$, $d^{14}$, $d^{15}$, and $d^{16}$ each independently represents an integer in the range of 0 to 4; $d^{17}$ independently represents an integer in the range of 0 to 5; $d^{18}$ independently represents an integer in the range of 0 to 4; $d^{19}$ independently represents an integer in the range of 0 to 5; $d^{20}$, $d^{21}$, and $d^{22}$ each independently represents an integer in the range of 0 to 5.]

Also, the present invention is:

(5) a resin composition for optical stereolithography according to any one of the above (1) to (4) containing an oxetane compound in an ratio of 35 mass % based on the mass of the cation-polymerization compound (A);

(6) a resin composition for optical stereolithography according to any one of the above (1) to (5), containing a cationic polymerization initiator (C) in a ratio of 0.1 to 10 mass % based on the mass of the cation-polymerizable organic compound (A), and a radical polymerization initiator (D) in a ratio of 0.1 to 10 mass % based on the mass of the radical polymerizable organic compound (6), wherein the content ratio of the cation-polymerizable organic compound (A) the radical polymerizable organic compound (B) is 30:70 to 90:10 (by mass); and, (7) a resin composition for optical stereolithography according to any one of the above (1) to (6), further comprising at least one dye selected from purple and blue dyes in a ratio of 0.02 to 5 ppm based on the total mass of the resin composition for optical stereolithography.

Also, the present invention is:

(8) a method for producing a stereolithographic product by conducting optical stereolithography using a resin composition for optical stereolithography according to any one of the above (1) to (7).

Advantageous Effects of Invention

The resin composition for optical stereolithography according to the present invention is excellent in safety and handling properties, because it is free from a toxic antimony-based cationic polymerization initiator, and contains, as a cationic polymerization initiator (C), an aromatic sulfonium compound (C-1) which is a phosphorous-based one.

The resin composition for optical stereolithography according to the present invention, which utilizes a phosphorous-based aromatic sulfonium salt as a cationic polymerization initiator but contains a cationic polymerization initiator consisting of an aromatic sulfonium compound (C-1), as well as an aromatic thiol compound (E) represented by the general formula (E), can produce a stereolithographic product having lower yellowness not only immediately after stereolithography but in the resin of high heat resistance which requires heat treatment, and having high light transmittance, thereby excellent colorless transparency and good color tone and appearance, compared with a resin composition for optical stereolithography which does not contain an aromatic thiol compound (E) but an aromatic sulfonium compound (C-1) as a cationic polymerization initiator (C).

The resin composition for optical stereolithography according to the present invention, containing an aromatic sulfonium compound (C-1) and aromatic thiol compound (E) as well as at least one dye selected from purple and blue dyes, can be used to produce a stereolithographic product exhibiting much reduced yellowness and excellent colorless transparency.

Optical stereolithography can be conducted by using the resin composition for optical stereolithography according to the present invention to produce a stereolithographic product having low yellowness, high light transmittance, good color tone and external appearance equivalent to or close to colorless translucency, and further having excellent mechanical properties such as strength, elastic property, impact resistance, toughness. Accordingly, the resin composition for optical stereolithography according to the present invention can be effectively used in various applications, for example, as a model for validation of appearance design of various kinds of industrial product in designing it, as a model to check functionality of a component, a resin mold to form a casting mold, a base model to form a metal mold, a lens for automobile and motorbike, in the field of fine arts and crafts for restoration or simulation of art works, for contemporary art, as a presentation model for a design of a building covered with glass, as a model for a precision component, an electric and electronic component, furniture, an architectural construction, an automobile component, various kinds of containers, casting, and the like, which requires a stereolithographic product having high transparency, appearance and color tone without yellowing, stereolithographic product having excellent mechanical properties such as strength, elastic property, impact resistance, toughness.

DESCRIPTION OF THE INVENTION

The present invention will be hereinafter illustrated in more detail.

The resin composition for optical stereolithography according to the present invention is a resin composition used to produce a stereolithographic product by conducting stereolithography upon irradiation with actinic energy beam such as light.

The resin composition for optical stereolithography according to the present invention contains a cation-polymerizable organic compound (A) and a radical polymerizable organic compound (B) as an actinic energy beam polymerizable compound which is polymerized upon irradiation with an actinic energy beam such as light.

It is noted that an "actinic energy beam" used herein refer to an energy beam such as light, an electron beam, X ray, radiant ray, high frequency ray, which can cure a resin composition for optical stereolithography.

In the resin composition for optical stereolithography according to the present invention, any organic compound can be used, which can generate a cation polymerization reaction and/or cation crosslinking reaction upon irradiation with an actinic energy beam in the presence of a cationic polymerization initiator (C) consisting of an aromatic sulfonium compound (C-1), as a cation-polymerizable organic compound (A).

A representative example of a cation-polymerizable organic compound (A) which can be used in the present invention includes an epoxy compound, an oxetane compound, and other cyclic ether compound, a cyclic acetal compound, a cyclic lactone compound, a spiroorthoester compound, a vinyl ether compound and the like. These cation-polymerizable organic compounds may be used alone or in a combination of two or more thereof.

Among them, an epoxy compound and an oxetane compound are preferably used as a cation-polymerizable organic compound (A) in the present invention.

In the present invention, an epoxy compound which can be used as a cation-polymerizable organic compound (A) may include epoxy compounds such as an alicyclic epoxy compounds, an aliphatic epoxy compounds, an aromatic epoxy compounds or the like.

The above described alicyclic epoxy compound includes a polyglycidylether of a polyvalent alcohol having at least one alicyclic ring; or a compound containing a cyclohexeneoxide structure obtained by epoxidation of a compound containing a cyclohexene ring or a cyclopentene ring with a suitable oxidant such as hydrogen peroxide, a peracid and the like, a compound containing a cyclopenteneoxide structure, or the like. More particularly, as an alicyclic epoxy compound includes, for example, an alicyclic diglyciclylether compound [hereinafter referred to as "alicyclic diglycidylether compound (A-1)"] represented by the following general formula (A-1);

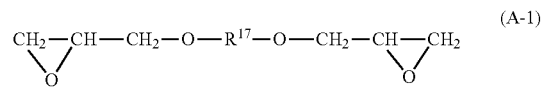

(wherein $R^{17}$ represents a hydrogenated bisphenol A residue, hydrogenated bisphenol F residue, hydrogenated bisphenol Z residue, hydrogenated bisphenol AD residue, cyclohexanedimethanol residue or tricyclodecanedimethanol residue.) includes hydrogenated bisphenol A diglycidylether, a hydrogenated bisphenol F diglycidylether, hydrogenated bisphenol AD digiycidylether, hydrogenated bisphenol Z diglycidylether, cyclohexanedimethanol diglycidylether, tricyclodecanedimethanol diglycidylether).

A compound containing cyclohexeneoxide structure or a compound containing cyclopentene oxide structure includes, for example, 3,4-epoxy cyclohexylmethyl-3',4'-epoxycyclohexane carboxylate, 3,4-epoxy-1-methyl cyclohexyl-3,4-epoxy-1-methyl cyclohexane carboxylate, 6-methyl-3,4-epoxy cyclohexylmethyl-6-methyl-3,4-epoxy cyclohexane carboxylate, 3,4-epoxy-3-methyl cyclohexylmethyl-3,4-epoxy-3-methyl cyclohexane carboxylate, 3,4-epoxy-5-methyl cyclohexylmeth-3,4-epoxy-5-methyl cyclohexane carboxylate 2-(3,4-epoxy cyclohexyl-5,5-spiro-3,4-epoxy)cyclohexane-metadioxane, bis(3,4-epoxy cyclohexylmethypadipate, 3,4-epoxy-6-methyl cyclohexyl carboxylate, dicyclopentadiene diepoxide, ethylenebis(3,4-epoxycyclohexanecarboxylate), dioctyl epoxyhexahydrophthalate, di-2-ethylhexyl epoxyhexaydrohthelate or the like.

It also includes ε-caprolactone-modified 3',4'-epoxycyclohexylmethyl 3,4-epoxycyclohexanecarboxylate, 1,2-epoxy-4-(2-oxiranyl)cyclohexane adduct of 2,2-bis(hydroxymethyl)-1-butanol, sold by DAICEL CORPORATION.

Moreover, bis(3,4-epoxycyclohexyl)methane, 2,2-bis(3,4-epoxy cyclohexyl)propane, 1,1-bis(3,4-epoxycyclohexyl) ethane, alpha-pineneoxide, camphorenealdehyde, limonene monoxide, limonene dioxide, 4-vinyl cyclohexene monooxide, 4-vinyl cyclohexene dioxide or the like.

The above described aliphatic epoxy compound which can be used as a cation-polymerizable organic compound (A) is not particularly limited, and such an aliphatic epoxy compound includes, for example, a polyglycidylether of an aliphatic polyvalent alcohol or an alkylene oxide adduct, polyglycidyl ester of an aliphatic long-chain polybasic acid, a homopolymer synthesized by vinyl polymerization of glycidyl acrylate or glycidyl methacrylate, a copolymer synthesized by vinyl polymerization of glycidyl acrylate and/or glycidyl methacrylate and other vinyl monomer, or the like.

A representative compound includes, for example, glycidylether of a polyvalent alcohol such as butylglycidylether, 2-ethylhexylglycidylether, glycidylether of a higher alcohol, diglycidylether of an alkylene diol (for example, diglycidylether of 1,4-butanediol, diglycidylether of 1,6-hexanediol, diglycidylether of neopentyl glycol or the like), triglycidylether of glycerin, diglycidylether of trimethylolpropane, triglycidylether of trimethylolpropane, tetraglycidylether of sorbitol, hexaglyciclylether of dipentaerythritol, diglycidylether of polyethylene glycol, diglycidylether of polypropylene glycol, diglycidylether of polytetramethylene glycol or the like.

Moreover, propylene, trimethylolpropane, a polyglycidyl ether of a polyetherpolyol obtained by adding one or two or more alkylene oxide to an aliphatic polyvalent alcohol such as glycerin, a diglycidyl ester of an aliphatic long-chain dibasic acid or the like may be included.

Also, monoglycidylether of an aliphatic higher alcohol, phenol, cresol, butylphenol monoglycidylether of polyether alcohol obtained by adding alkylene oxide thereto, glycidyl ester of a higher fatty acid, epoxidized soybean oil, butyl epoxystearate, epoxidized polybutadiene, glycidylated polybutadiene or the like may be included.

Also, epoxy alkane includes 1,2-epoxydecane, 1,2-epoxy dodecane, 1,2-epoxy tetradecane, 1,2-epoxycetane, 1,2-epoxyoctadecane, 1,2-epoxyicosane.

The aliphatic epoxy compound described above used as a cation-polymerizable compound (A) is not particularly limited but includes, for example, a polyglycidylether of an aliphatic polyvalent alcohol or an alkylene oxide adduct thereof, polyglycidyl ester of an aliphatic long-chain polybasic acid, a homopolymer synthesized by vinyl polymerization of glycidyl acrylate or glycidyl methacrylate, a copolymer synthesized by vinyl polymerization of glycidyl acrylate and/or glycidyl methacrylate and other, vinyl monomer or the like.

A representative compound includes, for example, glycidylether of a polyvalent alcohol such as butylglycidylether, 2-ethylhexylglycidylether, glycidylether of a higher alcohol, diglycidylether of 1,4-butanediol, diglycidylether of 1,6-hexanediol, diglycidylether of neopentyl glycol, triglycidylether of glycerin, diglycidylether of trimethylolpropane, triglycidylether of trimethylolpropane, tetraglycidylether of sorbitol, hexaglycidylether of dipentaerythritol, diglycidylether of polyethylene glycol, diglycidylether of polypropylene glycol, diglycidylether of polytetramethylene glycol or the like.

Moreover, propylene, trimethylolpropane, a polyglycidyl ether of a polyetherpolyol, a diglycidyl ester of an aliphatic long-chain dibasic acid and the like, obtained by adding one or two or more alkylene oxide to an aliphatic polyvalent alcohol such as glycerin may be included.

Moreover, monoglycidylether of an aliphatic higher alcohol, phenol, cresol, butylphenol or monoglycidylether of polyether alcohol obtained by adding alkylene oxide thereto, glycidyl ester of a higher fatty acid, epoxidized soybean oil, butyl epoxystearate, epoxidized polybutadiene, glycidylated polybutadiene or the like may be included.

Also, epoxy alkane includes 1,2-epoxy decane, 1,2-epoxy dodecane, 1,2-epoxy tetradecane, 1,2-epoxycetane, 1,2-epoxy octadecane, 1,2-epoxy icosane or the like.

The aromatic epoxy compound described above is not particularly limited but includes, for example, a polyglycidylether, a polyglycidyl ester of a polyvalent phenol or an alkylene oxide adduct thereof, and specifically includes, for example, bisphenol A, bisphenol E, bisphenol F, bisphenol AD, bisphenol Z; or glycidylether of a compound with an alkylene oxide such as ethylene oxide or propyleneoxide added thereto, phenylglycidylether, tert-butylphenylglycidylether, resorcinol diglycidylether, tetraglycidylether of tetraphenol ethane, triglycidylether of triphenol methane, a glycidylated product of a condensate of phenol or naphthol and aldehyde (for example, a phenolic resin or Novolac resin), a glycidylated product of a condensate of phenol and isopropenylacetophenone, a glycidylated product of phenol and dicyclopentadiene, diglycidyl ester of terephthalid acid, diglycidyl ester of isophthalic acid, diglycidyl ester of o-phthalic acid or the like.

Moreover, diglycidylether of biphenol, diglycidylether of tetramethylbiphenol, VG3101L represented by the following formula sold by Printech Co., Ltd. and other aromatic epoxy compound may also be included.

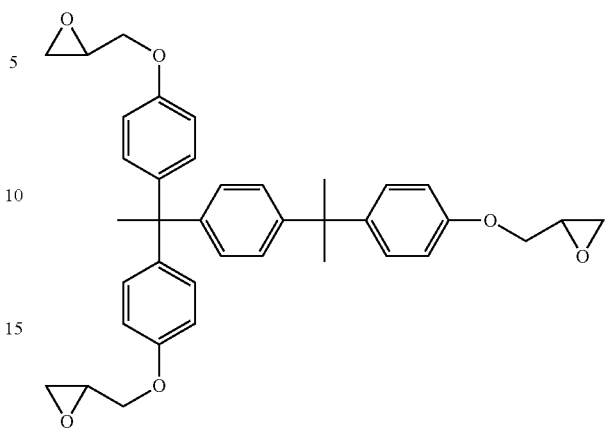

According to the present invention, one or two or more of the above-described epoxy compound may be used as a cation-polymerizable organic compound (A), and a polyepoxy compound having two or more epoxy groups per molecule is preferably contained in the ratio of 30 mass % or more based on the total mass of the cation-polymerizable organic compound (A).

When the resin composition for optical stereolithography according to the present invention contains, as a part of a cation-polymerizable organic compound (A), an alicyclic diglycidylether compound (A-1) represented by the above general formula (A-1), a stereolithographic product obtained by optical stereolithography exhibits more enhanced transparency, more reduced yellowness, and excellent dimensional stability over time water resistance, moisture resistance, heat resistance and the like.

Further, when the resin composition for optical stereolithography according to the present invention contains, as a cation-polymerizable organic compound (A), an aromatic compound having 3 or more glycidyletherfied phenol group represented by the following formula (A-2a) [hereinafter referred to as "an aromatic compound (A-2)"], a resin composition for optical stereolithography can be obtained which can provide a stereolithographic product having high heat deflection temperature and excellent heat resistance.

When an aromatic compound (A-2) is contained as a part of the cation-polymerizable organic compound (A) to enhance heat resistance of the stereolithographic product obtained by optical stereolithography, the content of the aromatic compound (A-2) is preferably 5 to 80 mass %, more preferably 10 to 50 mass %, even more preferably 20 to 40 mass %, based on the total mass of the cation-polymerizable organic compound (A).

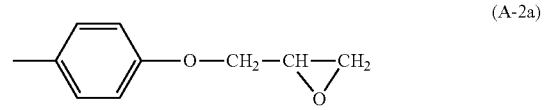

As an aromatic compound (A-2) having 3 or more glycidyletherfied phenol groups, any compounds can be used, wherein suitable viscosity of the resin composition for optical stereolithography is held at suitable one for optical stereolithography even if it contains the present aromatic compound (A-2), and includes, for example, a polyglycidylether a phenolic resin such as Novolac resin and resol resin; a tetraglycidylether of a tetraphenol ethane; a triglycidylether of a triphenolmethane; VG3101L, described above, that is, 2-[4-(2,3-epoxypropoxy)phenyl]-2-[4-[1,1-bis[4-([2,3-epoxypropoxy]phenyl]ethyl]phenyl]propan, and the like.

When VG3101L described above, that is 2-[4-(2,3-epoxy propoxy)phenyl]-2-[4-[1,1-bis[4-([2,3-epoxy propoxy]phenyl]ethyl]phenyl]propane is contained in a resin composition for optical stereolithography as a portion of a cation-polymerizable organic compound, heat deflection temperature of the stereolithographic product obtained by optical stereolithography is increased and heat resistance is enhanced. When VG3101L is contained as a portion of the cation-polymerizable organic compound (A) in order to enhance heat resistance of the stereolithographic product obtained by optical stereolithography, the content of VG3101L is preferably 1.5 to 80 mass %, more preferably 5 to 50 mass %, even more preferably 20 to 40 mass %, based on the total mass of the cation-polymerizable organic compound (A).

As an oxetane compound [hereinafter may be referred to as "oxetane compound (A-3)"], one or two or more of the polyoxetane compound having two or more oxetane groups per molecule can be used.

In particular, when an oxetane compound (A-3) is used as a portion of a cation-polymerizable organic compound (A), wherein a monooxetane compound having one oxetane group per molecule (A-3a) and a polyoxetane compound having 2 or more oxetane groups per molecule (A-3b) are used as oxetane compounds (A-3), at a mass ratio of monooxetane compound (A-3a):polyoxetane compound (A-3b)=95:5 to 5:95, particularly at a mass ratio of 10:90 to 90:10, especially at a mass ratio of 20:80 to 20:80, water- and moisture-absorption of the resin composition for optical stereolithography under high moisture conditions is reduced, and originally high sensitivity to curing can be maintained for a long period of time, and toughness of the stereolithographic product obtained by optical stereolithography is enhanced.

Under such a circumstance, as a monooxetane compound (A-3a), any compound can be used so long as it has one oxetane group per molecule, and particularly, a monooxetane monoalcohol compound having one oxetane group and one alcoholic hydroxyl group per molecule is preferably used.

Among such monooxetane monoalcohol compounds, at least one of monooxetane monoalcohol compound (A-3a1) represented by the following general formula ((A-3a) and monooxetane monoalcohol compound (A-3a$_2$) represented by the following general formula (A-3a$_2$) is more preferably used as a monooxetane compound due to its availability, high reactivity, low viscosity and the like.

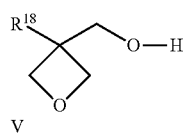

(A-3a$_1$)

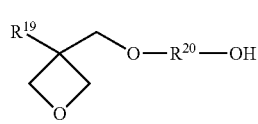

(A-3a$_2$)

(wherein $R^{18}$ and $R^{19}$ each represents C1-5 alkyl group, $R^{20}$ represents C2-10 an alkylene group which may have an ether bond.)

In the above general formula (A-3a$_1$), an example of $R^{18}$ includes methyl, ethyl, propyl, butyl, pentyl.

A specific example of a m nooxetane alcohol (A-3a$_1$) includes 3-hydroxymethyl-3-methyloxetane, 3-hydroxymethyl-3-ethyloxetane, 3-hydroxymethyl-3-propyloxetane, 3-hydroxymethyl-3-n-butyloxetane, 3-hydroxymethyl-3-propyloxetane or the like, one or two or more of which may be used. Among them, 3-hydroxymethyl-3-methyl oxetane, 3-hydroxymethyl-3-ethyloxetane are more preferably used due to availability, reactivity or the like.

In the above general formula (A-3a$_2$), an example of $R^{19}$ includes methyl, ethyl, propyl, butyl, pentyl.

Also, in the above general formula (A-3a$_2$), $R^{20}$ is a C2-10 alkylene group which may be either straight- or branched-chain alkylene group, or may be a C2-10 straight or branched alkylene group having an ether bond (an ethereal oxygen atom) interrupting the alkylene group (alkylene chain). A specific example of $R^{20}$ includes an ethylene group, trimethylene group, tetramethylene group, pentamethylene group, hexamethylene group, heptamethylene group, 3-oxypentylene group or the like. Among them, $R^{11}$ is preferably a trimethylene group, tetramethylene group, or heptamethylene group, for example, due to easy synthesis, easy handling because the corn pound is liquid at ambient temperature.

As a polyoxetane compound (A-3b), any compound having 2 oxetane groups, a compound having 3 or more oxetane groups, a compound having 4 or more oxetane groups may be used, but a dioxetane compound having 2 oxetane groups is preferably used. Among them, a dioxetane compound (A-3b$_0$) represented by the following general formula (A-3b$_0$):

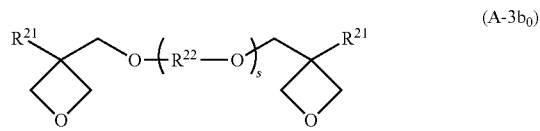

(A-3b$_0$)

(wherein two $R^{21}$s, the same or different from each other, represent a C1-5 alkyl group, $R^{13}$ represents a divalent organic group which may optionally have an aromatic ring, s represents 0 or 1.)

is preferably used due to its availability, reactivity, low moisture absorption, mechanical properties of the cured product, and the like.

In the above general formula (A-3b$_0$), an example of $R^{21}$ includes methyl, ethyl, propyl, butyl, pentyl. An example of $R^{22}$ includes a C1-12 straight or branched alkylene group (for example, ethylene, propylene, butylene, neopentylene, n-pentamethylene, n-hexamethylene or the like), a divalent group represented by formula: —CH$_2$-Ph-CH$_2$— or —CH$_2$-Ph-Ph-CH$_2$—, hydrogenated bisphenol A residue, hydrogenated bisphenol F residue, hydrogenated bisphenol Z residue, cyclohexanedimethanol residue, tricyclodecanedimethanol residue, terephthalic acid residue, isophthalic acid residue, o-phthalic acid residue, or the like.

A specific example of a dioxetane compound (A-3b$_0$) includes a dioxetane compound represented by the following formulae (A-3b$_1$) or (A-3b$_2$).

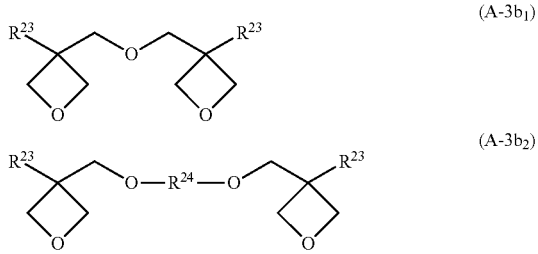

(A-3b₁)

(A-3b₂)

wherein, two $R^{23}$s the same or different from each other, represent a C1-5 alkyl group, $R^{24}$ represents a divalent organic group which may optionally have an aromatic ring.

A specific example of a dioxetane compound represented by the above formula (A3b₁) includes, bis(3-methyl-3-oxetanylmethyl)ether, bis(3-ethyl-3-oxetanylmethyl)ether, bis(3-propyl-3-oxetanylmethyl)ether, bis(3-butyl-3-oxetanylmethyl)ether or the like.

A specific example of a dioxetane compound represented by the above formula (A-3b₂) includes dioxetane compound wherein two $R^{14}$s simultaneously represent methyl, ethyl, propyl, butyl or pentyl group, and $R^{15}$ ethylene, propylene, butylene, neopentylene, n-pentamethylene group, n-hexamethylene group and the like), a divalent group represented by formula: —CH₂-Ph-CH₂— or —CH₂-Ph-Ph-CH₂—, hydrogenated bisphenol A residue, hydrogenated bisphenol F residue, hydrogenated bisphenol Z residue, cyclohexanedimethanol residue, tricyclodecanedimethanol residue.

Among them, as a polyoxetane compound (A-3b₀), bis(3-methyl-3-oxetanylmethyl)ether and/or bis(3-ethyl-3-oxetanylmethyl)ether of the above formula (A-3b₁), wherein two $R^{23}$s simultaneously represent methyl or ethyl, is preferably used due to its availability, low moisture absorption, mechanical properties of the cured product, and the like, and, particularly bis(3-ethyl-3-oxetanylmethyl)ether is more preferably used.

The resin composition for optical stereolithography according to the present invention includes the oxetane compound (A-3) preferably in a ratio of 1 to 35 mass %, more preferably 5 to 20 mass %, based on the total mass of the cation-polymerizable organic compound (A) contained in the resin composition for optical stereolithography, in the viewpoint of enhanced stereolithographic performance resulting from photo-curability and lowered viscosity.

Toughness of the stereolithographic product obtained by optical stereolithography will be enhanced when a diglycidylether of an alkylene diol is contained in the resin composition for optical stereolithography according to the present invention. As a diglycidylether of an alkylene diol, a diglycidylether of a C2-10 alkylene dial is preferred, such as ethylene glycol diglycidylether, propylene glycol diglycidylether, butanediol digiycidylether, pentanediol diglycidylether, hexanediol diglycidylether, heptanediol diglycidylether, octanediol diglycidylether, nonanediol diglycidylether, decanediol diglycidylether, and one or two or more of them may be used. Among them, 1,6-hexanediol diglycidylether is more preferably used due to curability.

When a diglycidylether of an alkylene diol is contained in the resin composition for optical stereolithography according to the present invention in order to enhance toughness of the stereolithographic product obtained by optical stereolithography, the content of a diglycidylether of a alkylene diol is preferably 0.1 to 20 mass %, more preferably 0.5 to 10 mass %, and still more preferably 1 to 5 mass % based on the total mass of the cation-polymerizable organic compound (A) contained in the resin composition for optical stereolithography.

A representative example of a radical polymerizable organic compound (B) includes a compound having (meth)acrylate group, a unsaturated polyester compound, an allyl urethane-based compound, a polythiol compound, or the like, and one or two or more of the above-described a radical polymerizable organic compound can be used. Among them, a compound having at least one (meth)acryloyloxy group per molecule is preferably used. A specific example includes a reaction product of epoxy compound and (meth)acrylic acid, (meth)acrylic acid ester of alcohol, urethane(meth)acrylate, polyester(meth)acrylate, polyether(meth)acrylate, or the like.

The reaction product of the above-described epoxy compound and (meth)acrylic acid includes, a (meth)acrylate-based reaction product obtained by reacting an aromatic an epoxy compound, an alicyclic epoxy compound and/or an aliphatic epoxy compound with (meth)acrylic acid. A specific example includes a (meth)acrylate obtained by reacting (meth)acrylic acid with glycidyl ether which is obtained by bisphenol compound such as bisphenol A or bisphenol S or a bisphenol compound such as bisphenol A or bisphenol S having a benzene ring substituted, for example, by an alkoxy group, or an alkylene oxide adduct of the above-described phenol compound or substituted bisphenol compound with an epoxydizing agent such as epichlorhydrin; a (meth)acrylate-based reaction product obtained by reacting epoxy Novolac resin with (meth)acrylic acid; or the like.

A (meth)acrylic acid ester of the above-described alcohol includes a (meth)acrylate obtained by reacting an aromatic alcohol, aliphatic alcohol, alicyclic alcohol and/or alkylene oxide thereof, having at least one hydroxyl group, with (meth)acrylic acid.

More particularly, for example, di(meth)acrylate of bisphenol compound such as bisphenol A and bisphenol S or of bisphenol compounds such as bisphenol A and bisphenol S having a benzene ring substituted, for example, with an alkoxy group, 2-ethylhexyl(meth)acrylate, 2-hydroxyethyl (meth)acrylate, 2-hydroxypropyl(meth)acrylate, lauryl (meth)acrylate, stearyl(meth)acrylate, iso-octyl(meth)acrylate, tetrahydrofurfuryl(meth)acrylate, isobornyl(meth) acrylate, benzyl(meth)acrylate, 1,4-butanediol di(meth) acrylate, 1,6-hexanediol di(meth)acrylate, diethylene glycol di(meth)acrylate, triethylene glycol di(meth)acrylate, neopentyl glycol di(meth)acrylate, polyalkylene glycol di(meth) acrylate [e.g., polyethylene glycol di(meth)acrylate, polypropylene glycol di(meth)acrylate, polytetramethylene glycol di(meth)acrylate, etc.], trimethylolpropanetri(meth)acrylate, ditrimethylolpropanetetra(meth)acrylate, pentaerythritol tetra(meth)acrylate, poly(meth)acrylate of a polyhydric alcohol having 3 or more hydroxyl groups such as dipentaerythritol hexa(meth)acrylate, a (meth)acrylate of an alkylene oxide adduct of the above-described polyhydric alcohol such as diol, triol, tetraol, hexaol or the like.

The above-described urethane(meth)acrylate includes, for example, a (meth)acrylate obtained by reacting a hydroxyl-containing (meth)acrylic acid ester with an isocyanate compound. The above-described hydroxyl-containing (meth) acrylic acid ester preferably includes a hydroxyl-containing (meth)acrylic acid ester obtained by a esterification reaction of an aliphatic divalent alcohol and (meth)acrylic acid. A specific example includes 2-hydroxyethyl(meth)acrylate or the like. Also, an isocyanate compound is preferably a polyisocyanate compounds having 2 or more isocyanate groups per molecule, such as tolyleriediisocyanate, hexamethylenediisocyanate, isophorone isocyanate.

Moreover, the above-described polyester(meth)acrylate includes polyester(meth)acrylate obtained by reacting a hydroxyl-containing polyester with a (meth)acrylic acid.

Also, the above-described polyether(meth)acrylate includes a polyether acrylate obtained by reacting a polyether containing a hydroxyl group with an acrylic acid.

Toughness of a stereolithographic product obtained from a resin composition for optical stereolithography will be enhanced, when a polyalkyleneglycol di(meth)acrylate such as polytetramethyleneglycol di(meth)acrylate, polypropyleneglycol di(meth)acrylate, polyethyleneglycol di(meth)acrylate is contained in the resin composition for optical stereolithography as a part of a radical polymerizable organic compound (B) in an amount in the range of 1~40 mass %, particularly 5~20 mass % based on the mass of the radical polymerizable organic compound (B). However, too much polyalkylene glycol di(meth)acrylate content will give a stereolithographic product with lowered heat deflection temperature and reduced heat resistance.

A resin composition for optical stereolithography according to the present invention contains an aromatic sulfonium compound (C-1) represented by the following general formula (C-1) as a cationic polymerization initiator (C).

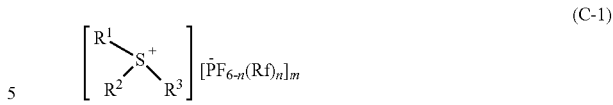

[in the above general formula (C-1), $R^1$, $R^2$, and $R^3$ represents a monovalent organic group, Rf represents a fluoroalkyl group, m is the same number as the cationic charge of the "cation$[S^+(R^1)(R^2)(R^3)]$", n is an integer in the range of 0-6.]

An aromatic sulfonium compound (C-1) is a salt wherein a cation represented by a formula: $[S^+(R^1)(R^2)(R^3)]$ and an anion represented by a formula: $[P—F_{6-n}(Rf)_n]$ are ionically bonded.

$R^1$, $R^2$, and $R^3$, which is a monovalent organic group in an aromatic sulfonium compound (C-1), each independently represents any of a monovalent aromatic group which may have a substituent, a monovalent aliphatic group which may have a substituent, or a monovalent heterocyclic group which may have a substituent. Among them, it is preferred that $R^1$, $R^2$, and $R^3$, each independently represents a monovalent aromatic group which may have a substituent on an aromatic ring, the monovalent aromatic group may optionally have one or two or more of a bond selected from —S— (thioether bond), —SO— (sulfoxide bond), —O— (ether bond) and —O— (carbonyl bond), in terms of catalytic activity, availability, handling properties, or the like.

A representative example of $R^1$, $R^2$, and $R^3$ in the above general formula (C-1) includes, but not limited to, a group represented by the following formulae <1> to <11>.

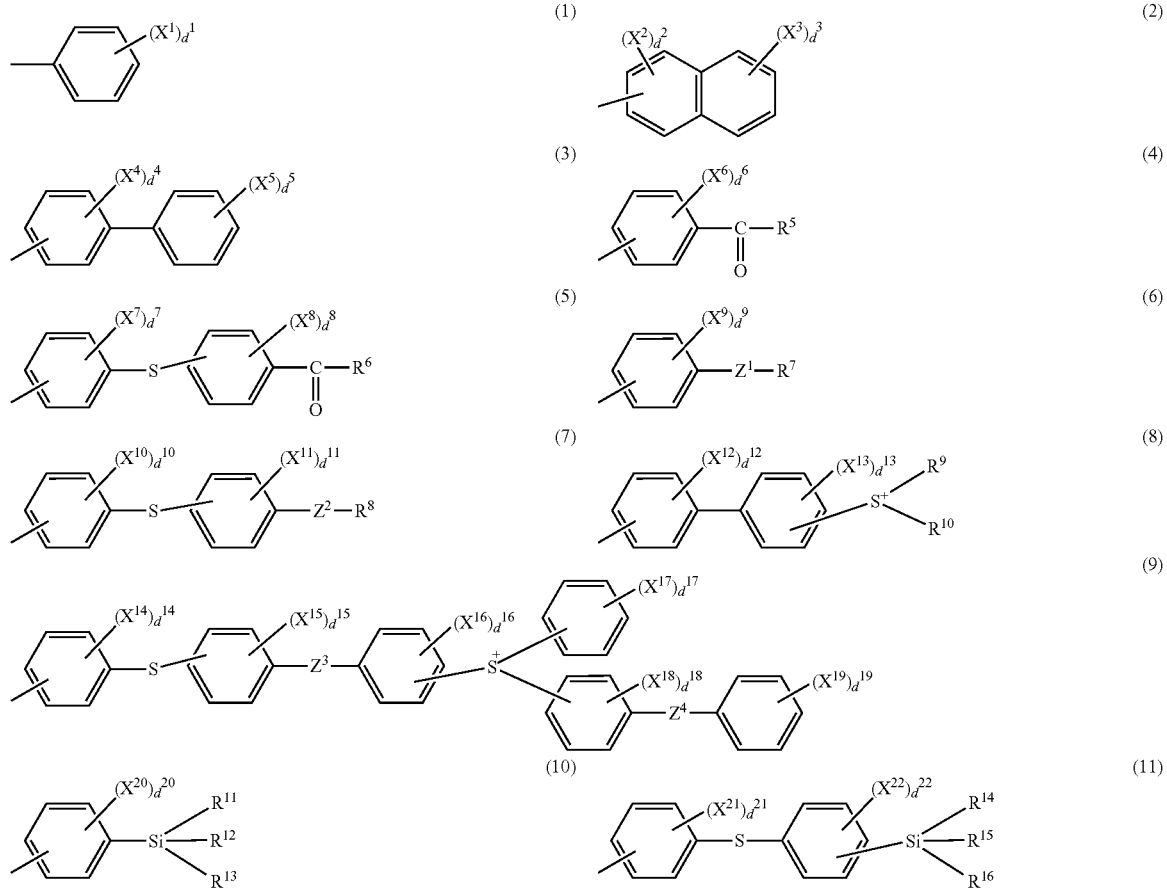

[wherein $R^5, R^6, R^7, R^8, R^9, R^{10}, R^{11}, R^{12}, R^{13}, R^{14}, R^{15}$, and $R^{16}$ each independently represent an alkyl or aryl group which may have a substituent group, $X^1, X^2, X^3, X^4, X^5, X^6, X^7, X^8, X^9, X^{10}, X^{11}, X^{12}, X^{13}, X^{14}, X^{15}, X^{16}, X^{17}, X^{18}, X^{19}, X^{20}, X^{21}$, and $X^{22}$ each independently represent a group selected from an alkyl group, an aryl group, an alkoxy group, an aryloxy group, a hydroxy(poly)alkyleneoxy group, hydroxyl group, cyano group, nitro group, and halogen atom $Z^1, Z^2, Z^3$ and $Z^4$, each independently represents a divalent group selected from formula; —S—, —SO—, and —O—, $d^1$ independently represents an integer in the range of 0 to 5; $d^2$, $d^3$, and $d^4$ each independently represents an integer in the range of 0 to 4; $d^5$ independently represents an integer in the range of 0 to 5; $d^6, d^7, d^8, d^9, d^{10}, d^{11}, d^{12}, d^{13}, d^{14}, d^{15}$, and $d^{16}$ each independently represents an integer in the range of 0 to 4; $d^{17}$ independently represents an integer in the range of 0 to 5; $d^{18}$ independently represents an integer in the range of 0 to 4; $d^{19}$ independently represents an integer in the range of 0 to 5; $d^{20}, d^{21}$, and $d^{22}$ each independently represent an integer the range of 0 to 4.]

More particularly, a group represented by formula <1> includes, but not limited to, phenyl; phenyl substituted with a halogen atom, such as chlorophenyl, bromophenyl; phenyl substituted with an alkyl group such as methylphenyl, ethylphenyl; hydroxyphenyl or the like.

A group represented by formula <2> includes, for example, naphthyl, halogen-substituted naphthyl, alkyl-substituted naphthyl, hydroxyl group-substituted naphthyl or the like.

A group represented by formula <3> includes, for example, biphenylyl, halogen-substituted biphenylyl, alkyl-substituted biphenylyl, hydroxyl-substituted biphenylyl or the like.

A group represented by formula <4> includes, for example, methylcarbonylphenyl, benzoylphenyl, the above-described group wherein a hydrogen atom in a benzene ring is substituted, for example, with a halogen atom such as chlorine, bromine, an alkyl group such as methyl, ethyl, a hydroxy group, or the like.

A group represented by formula <5> includes, for example, methylcarbonylphenylthiophenyl, benzoylphenylthiophenyl, the above-described group wherein a hydrogen atom in a benzene ring is substituted, for example, with a halogen atom such as chlorine, bromine, an alkyl group such as methyl, ethyl, a hydroxy group, or the like.

A group represented by formula <6> includes, for example, methylthiophenyl, phenylthiophenyl, naphthylthiophenyl, methoxyphenyl, phenoxyphenyl, naphthoxyphenyl, a group represented by formula <6> wherein $R^7$ represents phenyl or methyl, and $Z^1$ represents —SO—, the above-described group wherein a hydrogen atom in an aromatic ring is substituted with a halogen atom such as chlorine, bromine, an alkyl group such as methyl, ethyl, hydroxyl group, or the like.

A group represented by formula <7> includes, for example, methylthiophenylthiophenyl, phenylthiophenylthiophenyl, naphthylthiophenylthiophenyl, methoxyphenylthiophenyl, pherioxyphenylthiophenyl, naphthoxyphenylthlophenyl, a group represented by formula <7> wherein $R^{10}$ represents phenyl or methyl group, and $Z^2$ represents —SO—, the above-described group wherein a hydrogen atom in an aromatic ring is substituted with a halogen atom such as chlorine, bromine, an alkyl group such as methyl, ethyl, hydroxyl group, or the like.

A group represented by formula <8> includes, for example, diphenylthiobiphenylyl, dinaphthylthiobiphenylyl, dimethyl thiobiphenylyl, the above-described group wherein a hydrogen atom in an aromatic ring is substituted with a halogen atom such as chlorine, bromine, an alkyl group such as methyl, ethyl, hydroxyl group, or the like.

A group represented by formula <9> includes, for example, a group represented by formula <9> wherein $Z^3$, and $Z^4$ represent —S—, a group represented by formula <9> wherein $Z^3$ and $Z^4$ represent —SO—, the above-described group wherein a hydrogen atom in a benzene ring is substituted, for example, with a halogen atom such as chlorine, bromine, an alkyl group such as methyl, ethyl, a hydroxy group, or the like.

A group represented by formula <10> includes, for example, trialkylsilylphenyl such as trimethylsilylphenyl, triethylsilylphenyl; triphenylsilylphenyl, dialkylphenylsilylphenyl such as dimethylphenyisilylphenyl, alkyldiphenylsilylphenyl such as methyldiphenylsilylpheny, the above-described group wherein a hydrogen atom in a benzene ring is substituted, for example, with a halogen atom such as chlorine, bromine, an alkyl group such as methyl, ethyl, a hydroxy group, or the like.

A group represented by formula <11> includes, for example, trialkylsilylphenylthlophenyl such as trimethylsilylphenylthiophenyl, triethylsilylphenylthiophenyl, triphenylsilylphenylthiophenyl, dialkylphenylsilylphenylthlophenyl such as dimethylphenyisilylphenylthiophenyl, alkyldiphenylsilylphenylthiophenyl such as methyldiphenyisilylphenylthiaphenyi, the above-described group wherein a hydrogen atom in a benzene ring is substituted, for example, with a halogen atom such as chlorine, bromine, an alkyl group such as methyl, ethyl, a hydroxy group, or the like.

$R^1$, $R^2$, and $R^3$ may represent a group different from one another, or two of $R^1$, $R^2$, and $R^3$ may represent the same group, while the remaining group may represent a different group, or all of $R^1$, $R^2$ and $R^3$ may represent the same group.

A cation $[S^+(R^1)(R^2)(R^3)]$ in an aromatic sulfonium compound (C-1) includes, but not limited to, the following cations <a-1> to (a-20),

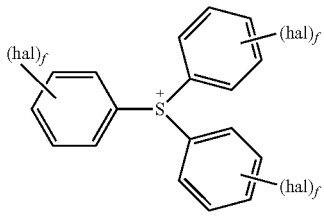

Cation (a-1)

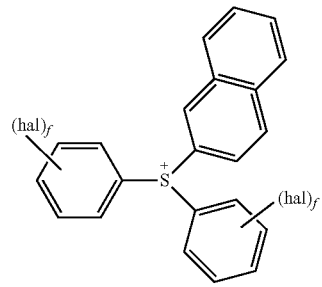

Cation (a-2)

-continued
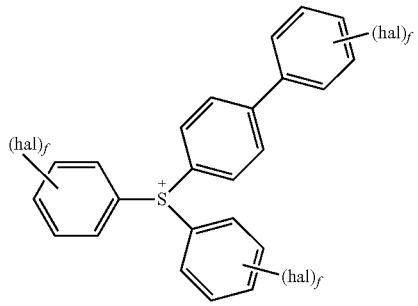
Cation (a-3)
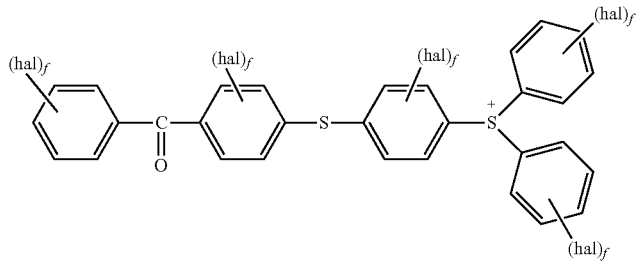
Cation (a-4)
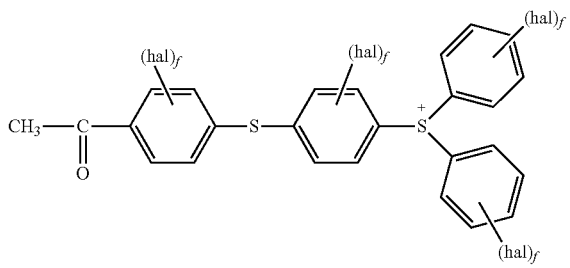
Cation (a-5)
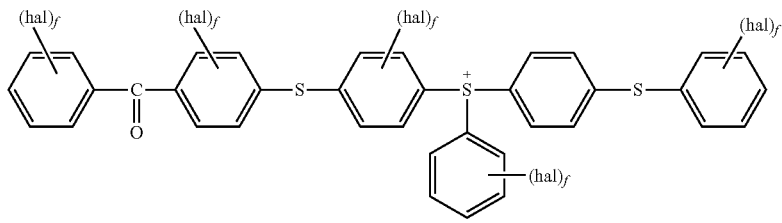
Cation (a-6)
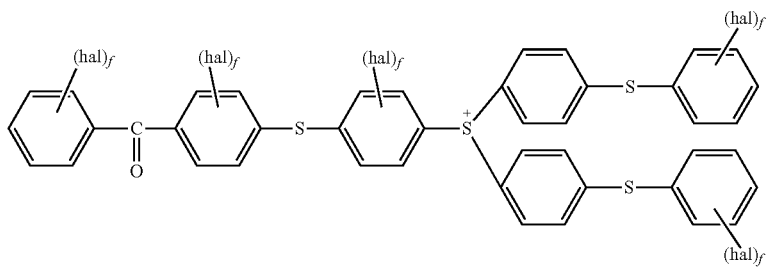
Cation (a-7)
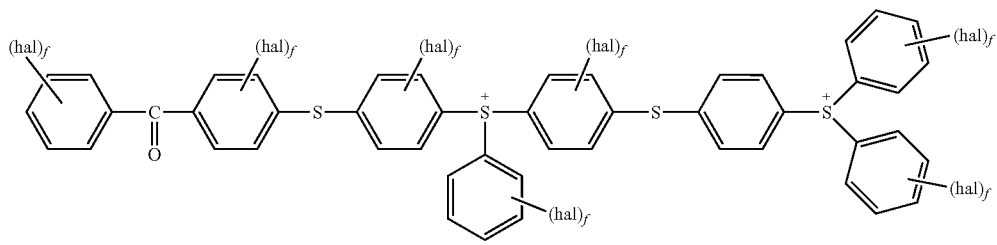
Cation (a-8)

-continued
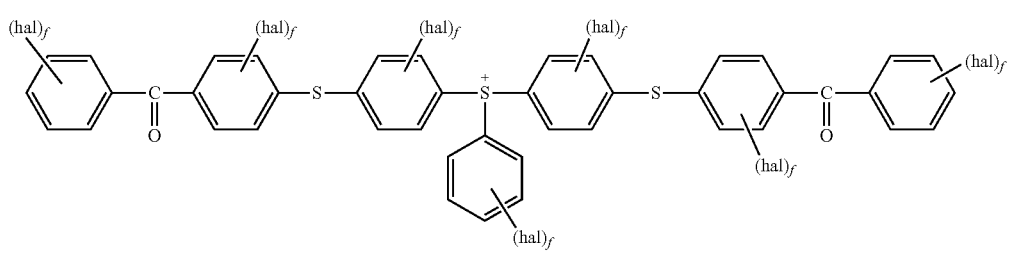
Cation (a-9)
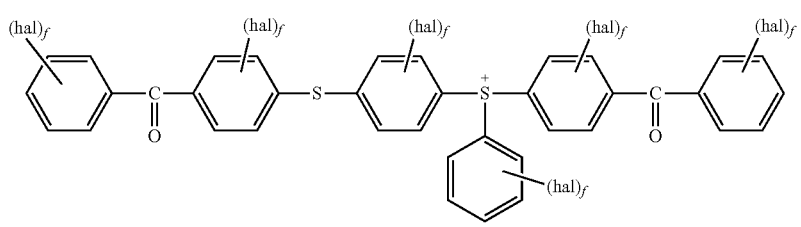
Cation (a-10)
[wherein hal represents chlorine or fluorine atom, f represents 0 or 1, f, which represents the number of substituents of the plural substituents (hal)$_f$ in a cation group, is independently 0 or 1.
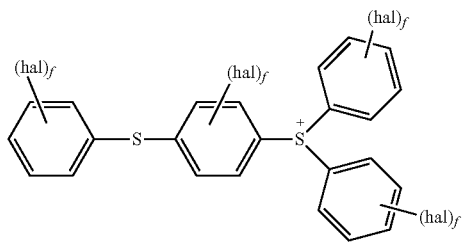
Cation (a-11)
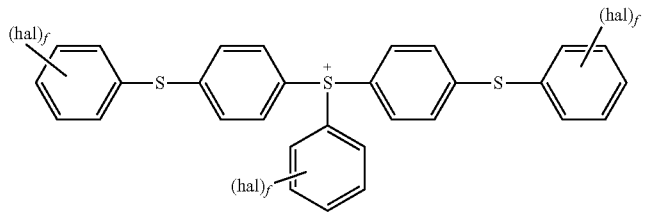
Cation (a-12)
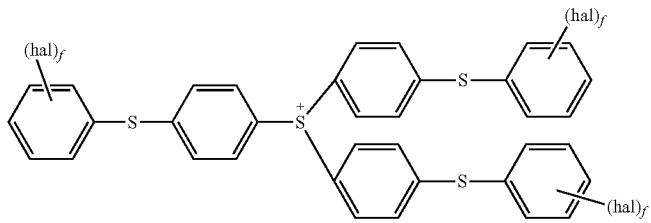
Cation (a-13)
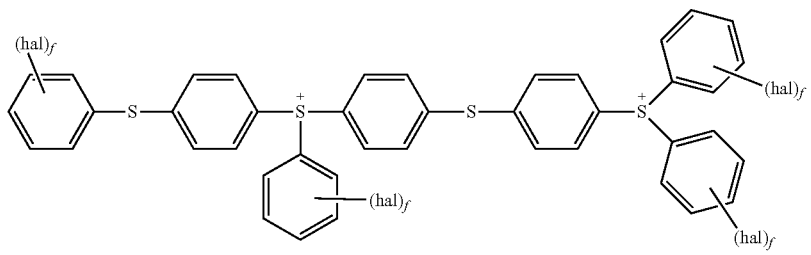
Cation (a-14)

-continued

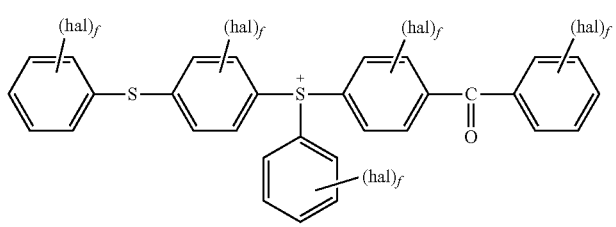

Cation (a-15)

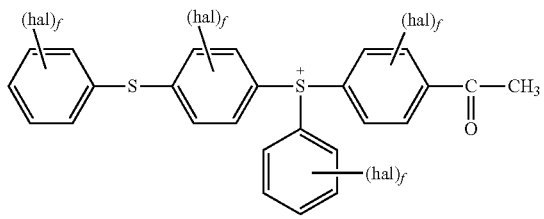

Cation (a-16)

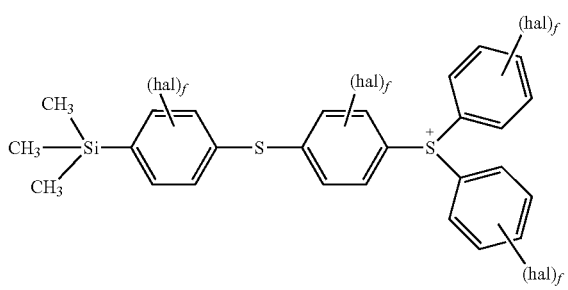

Cation (a-17)

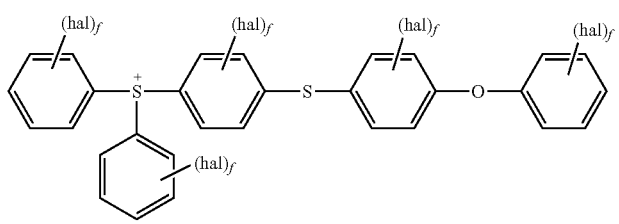

Cation (a-18)

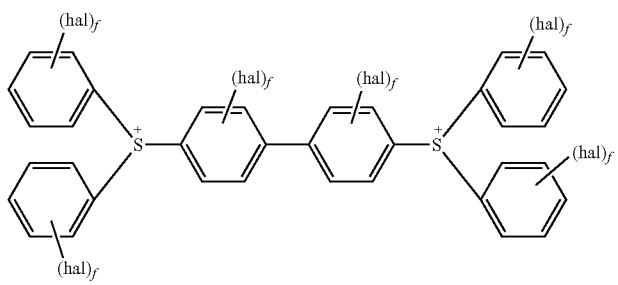

Cation (a-19)

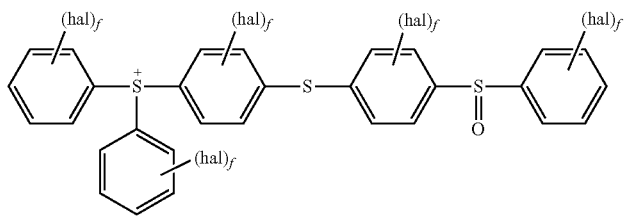

Cation (a-20)

[wherein hal represents chlorine or fluorine atom, f represents 0 or 1, f, which represents the number of substituents of the plural substituents (hal)$_f$ in a cation group, is independently 0 or 1.]

In an aromatic sulfonium compound (C-1), Rf is a fluoroalkyl group, preferably a C1-10 fluoroalkyl group, preferably a C1-8 fluoroalkyl group, more preferably a C1-4 fluoroalkyl group. Rf is preferably a fluoroalkyl group, wherein 80% or more, particularly 90% or more, especially 100% of a hydrogen atom in an alkyl group is substituted with a fluorine atom, considering catalytic activity of the aromatic sulfonium compound (C-1).

A specific example of a preferred Rf includes CF$_3$—, C$_2$F$_5$—, CF$_3$CF$_2$CF$_2$—, (CF$_3$)$_2$CF—, C$_4$F$_9$—, C$_6$F$_{13}$—, C$_7$F$_{15}$—, C$_8$F$_{17}$— or the like. Particularly, CF$_3$—, C$_2$F$_5$—, CF$_3$CF$_2$CF$_2$, (CF$_3$)$_2$CF—, or C$_4$F$_9$— is preferred.

In aromatic sulfonium compound (C-1), n is an integer in the range of 0-6. An aromatic sulfonium compound (C-1), wherein n is an integer in the range of 1-6, particularly n is 3, is preferably used because it has high activity as a cationic polymerization initiator.

In an aromatic sulfonium compound (C-1), m is the same number as the cationic charge of the cation [S$^+$(R$^1$)(R$^2$)(R$^3$)].

In an aromatic sulfonium compound (C-1), a specific example of an anion represented by formula [P—F$_{6-n}$(Rf)$_n$] includes the following anions (b-1) to (b-12).

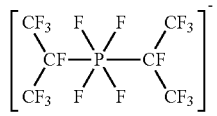
Anion (b-1)

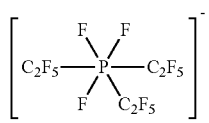
Anion (b-2)

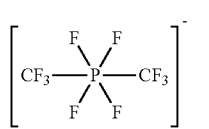
Anion (b-3)

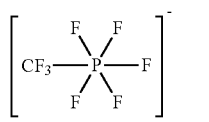
Anion (b-4)

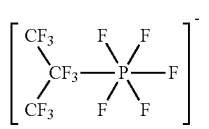
Anion (b-5)

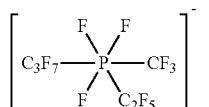
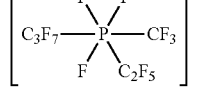
Anion (b-6)

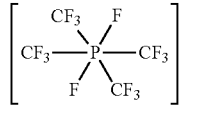
Anion (b-7)

Anion (b-8)

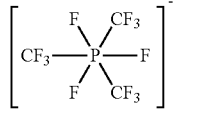
Anion (b-9)

-continued

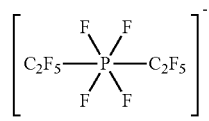
Anion (b-10)

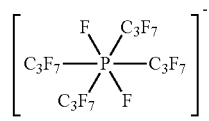
Anion (b-11)

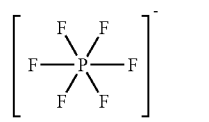
Anion (b-12)

A specific example of an aromatic sulfonium compound (C-1) which can be utilized in the present invention includes, but not limited to, the following compounds <a> to <m>.

<a> a compound wherein one cation (a-1) and any one anion of (b-1) to (b-12) are ionically bonded;
<b> a compound wherein a cation (a-2) and any one of anions (b-1) to (b-12) are ionically bonded;
<c> a compound wherein one cation (a-3) and any one of anion (b-1) to (b-12) are ionically bonded;
<d> a compound wherein one cation (a-4) and any one of anions (b-1) to (b-12) are ionically bonded;
<a> a compound wherein one cation (a-5) and any one of anions (b-1) to (b-12) are ionically bonded;
<f> a compound wherein one cation (a-6) and any one of anions (b-1) to (b-12) are ionically bonded;
<g> a compound wherein one cation (a-7) and am one of anion (b-1) to (b-12) are ionically bonded;
<h> a compound wherein one cation (a-8) and any two of anions (b-1) to (b-12) are ionically bonded;
<i> a compound wherein one cation (a-9) and any one of anions (b-1) to (b-12) are ionically bonded;
<j> a compound wherein one cation (a-10) and any one of anions (b-1) to (b-12) are ionically bonded;
<k> a compound wherein one cation (11) and any one of anions (b-1) to (b-12) are ionically bonded;
<l> a compound wherein one cation (a-12) and any one of anions (b-1) to (b-12) are ionically bonded;
<m> a compound wherein one cation (a-13) and any one of anions (b-1) to (b-12) are ionically bonded;
<n> a compound wherein one cation (a-14) and any two of anions (b-1) to (b-12) are ionically bonded,
<o> a compound wherein one cation (a-15) and any one of anions (b-1) to (b-12) are ionically bonded,
<p> a compound wherein one cation (a-6) and any one of anions (b-1) to (b-12) are ionically bonded;
<q> a compound wherein one cation (7) and any one of anions (b-1) to (b-12) are ionically bonded;
<r> a compound wherein one cation (a-18) and any one of anions (b-1) to (b-12) are ionically bonded;
<s> a compound wherein one cation (a-19) and at any two of anions (b-1) to (b-12) are ionically bonded;
<t> a compound wherein one cation (a-20) and any one of anions (b-1) to (b-12) are ionically bonded.

In the present invention, one or two or more of the above-described compound is used as an aromatic sulfonium compound (C-1).

A method for producing an aromatic sulfonium compound (C-1) used in the present invention is not particularly limited.

The compound can be produced, for example, by a method described in Patent References 4, 5. An aromatic sulfonium compound (C-1) is available from SAN-APRO LIMITED as "CPI-100P", "CPI-110P", "CPI-200K", "CPI-210S", "CPI-500K", CP1-500P or the like. It is also available from ADEKA CORPORATION as ADEKAOPTOMER SP-150, ADEKAOPTOMER SP-152, ADEKAOPTOMER SP-300 or the like.

Among them, CPI-200K and/or CPI-500K is preferably used as an aromatic sulfonium compound (C-1) because a stereolithographic product obtained by optical stereolithography has low yellowness and high activity as a cationic polymerization initiator.

The resin composition for optical stereolithography according to the present invention contains an aromatic thiol compound (E) represented by the following general formula (E) as well as an aromatic sulfonium compound (C-1) which is a cationic polymerization initiator. Inclusion of an aromatic thiol compound (E) in association with an aromatic sulfonium compound (C-1) will enable to provide a stereolithographic product having low yellowness, colorless transparency, or good color tone and external appearance close to colorless transparency.

(wherein $R^4$ represents a mono- or di-valent aromatic hydrocarbon which may optionally have a substituent p is an integer of 1 or 2.)

A representative example of an aromatic thiol compound (E) includes an aromatic thiol compound represented by the following general formulae (E1) to (E4).

(wherein $R^{4a}$ represents a monovalent aromatic hydrocarbon which may optionally have a substituent, $R^{4b}$, $R^{4c}$, $R^{4d}$, $R^{4e}$, and $R^{4f}$ represent a divalent aromatic hydrocarbon which may optionally have a substituent.)

In the above general formula (E1), a representative example of $R^{4a}$ includes a monovalent aromatic group such as phenyl, naphthyl, anthracenyl, indenyl, tolyl, biphenylyl, which may optionally have a substituent. When a group having a substituent, such substituent includes an alkyl group, an alkoxy group, a halogen atom, hydroxyl group or the like.

In the above general formulae (E2) to (E4), a representative example of $R^{4b}$, $R^{4c}$, $R^{4d}$, $R^{4e}$, and $R^{4f}$ includes phenylehe, naphthylene, anthracelnylene, indenylene, tolylene, biphertylene, a group represented by formula: -Ph-S-Ph-, a divalent aromatic group represented by formula: -Ph-O-Ph-, these aromatic groups may optionally have a substituent. Where it has a substituent, such a substituent includes an alkyl group, an alkoxy group, a halogen atom, hydroxyl group, or the like.

A specific example of an aromatic thiol compound (E) includes benzenethiol, naphthaienethiol such as 1-naphthalenethiol, 2-naphthalenethiol, an aromatic thiol compound having one mercapto group such as anthracenethiol, toluenethiol, xylenethiol, biphenylthiol, biphenyletherthiol, thiobissulfide thiol (diphenylsulfide thiol, mercaptodiphenylsuifide), a compound whose aromatic ring is substituted with a substituent such as an alkyl group, an alkoxy group, a halogen atom, hydroxyl group or the like, an aromatic thiol compound having two mercapto groups, such as dimercaptobenzene(benzenedithiol), dimercaptonaphthalene, dimercaptoanthracene, dimercaptotoluene, dimercaptoxylene, dimercaptobiphenyl, biphenyletherciithiol, dimercaptodiphenylsulfide, a compound whose aromatic ring is substituted with a substituent such as an alkyl group, an alkoxy group, a halogen atom, hydroxyl group, or the like.

In the present invention, one aromatic thiol compound (E) may be used, or two or more aromatic thiol compounds may be used in combination.

Among them, naphthalenethiol, dimercaptonaphthalene, dimercaptodiphenylsulfide are preferably used, because they are readily available, have little odor, have good solubility in a resin composition for optical stereolithography, seldom have effect on curing reaction, and significantly reduce yellowness of a stereolithographic product obtained by optical stereolithography.

The content of an aromatic thiol compound (E) in a resin composition for optical stereolithography is preferably 0.1-5 mass %, more preferably 0.2~2 mass % based on the mass of an aromatic sulfonium compound (C-1).

Too low content of the aromatic thiol compound (E) lessen yellowness-lowering effect, whereas too much content of the aromatic thiol compound (E) tends to reduce photo-curability.

The resin composition for optical stereolithography according to the present invention can utilize, as a radical polymerization initiator (D), any polymerization initiator which can initiate radical polymerization of a radical polymerizable organic compound (B) upon irradiation with an actinic energy beam such as light, and includes, for example, benzyl or adialkylacetal-based compound thereof, phenylketone-based compound, acetophenone-based compound, benzoin or an alkylether-based compound thereof, benzophenone-based compound, thioxanthone-based compound or the like.

Specifically, benzyl or a dialkylacetal-based compound thereof includes, for example, berizyldimethylketal, benzyl-β-methoxyethylacetal or the like.

A phenylketone-based compound include, for example, 1-hydroxy-cyclohexylphenylketone or the like.

An acetophenone-based compound includes, for example, diethoxyacetophenone, 2-hydroxymethyl-1-phenylpropane-1-one, 4'-isopropyl-2-hydroxy-2-methyl-propiophenone, 2-hydroxy-2-methyl-propiophenone, p-dimethyl aminoacetophenone, p-tert-butyldichloroacetophenone, p-tert-butyltrichloroacetophenone, p-azidebenzalacetophenone or the like.

A benzoin-based compound includes, for example, benzoin, benzoin methyl ether, benzoin ethylether, benzoin isopropyl ether, benzoin n-butylether, benzoin isobutylether or the like.

A benzophenone-based compound includes, for example, benzophenone, methyl o-benzoylbenzoate, Michler's ketone, 4,4'-bisdiethylaminobenzophenone, 4,4'-dichlorobenzophenone or the like.

A thioxanthone-based compound includes, for example, thioxanthone. 2-methyl thioxanthone, 2-ethylthioxanthone, 2-chlorothioxanthone, 2-isopropyl thioxanthone or the like.

According to the present invention, one or two or more radical polymerization initiator (D) may be compounded to use depending on the desired performance.

According to the present invention, as a radical polymerization initiator (D), 1-hydroxycyclohexylphenylketone is preferably used, because a stereolithographic product obtained by optical stereolithography has excellent strength, heat resistance, good reactivity, and good hue (for example, low yellowness).

The resin composition for optical stereolithography according to the present invention preferably contains a cation-polymerizable organic compound (A) and a radical polymerizable organic compound (B) in a mass ratio of cation-polymerizable organic compound (A):a radical polymerizable organic compound (B)=30:70 to 90:10, particularly, 50:50 to 90:10, especially 60:40 to 90:10, in terms of photo-curability, stereolithographic speed, dimensional stability, mechanical properties of the resulting stereolithographic product or the like.

The resin composition for optical stereolithography according to the present invention contains cationic polymerization initiator (C) in a ratio of 0.1~10 mass %, particularly 1~5 mass % based on the mass of a cation-polymerizable organic compound (A), and a radical polymerization initiator (D) in a ratio of 0.1~10 mass %, particularly 1~5 mass % based on the mass of a radical polymerizable organic compound (B).

The resin composition for optical stereolithography according to the present invention may optionally contain a polyalkylene ether-based compound. Where the composition contains a polyalkylene ether-based compound, the resulting stereolithographic product has enhanced toughness, thus it becomes heavy duty and less brittle.

As a polyalkylene ether-based compound, particularly, a polyalkylene ether-based compound represented by the following general formula (F) [hereinafter referred to as "polyalkylene ether-based compound (F)"] is preferably utilized.

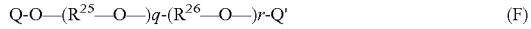

$$Q\text{-}O\text{---}(R^{25}\text{---}O\text{---})q\text{-}(R^{26}\text{---}O\text{---})r\text{-}Q' \qquad (F)$$

[wherein $R^{25}$ and $R^{26}$ each represent a different straight or branched C2-5 alkylene, Q and Q' each independently represent a hydrogen atom, an alkyl group, phenyl group, acetyl or benzoyl, q and r each independently represent an integer of 0 or 1 (provided that q and r should not simultaneously represent 0).]

In a polyalkylene ether-based compound (F) represented by the above general formula (F), where both q and represent an integer of 1 or more, and a sum of q and r is 3 or more, an oxyalkylene unit (an alkylene ether unit): —$R^{25}$—O— and an oxyalkyne unit (an alkylene ether unit): —$R^{26}$—O— may be bonded randomly or in block, or a mixture thereof.

In the above-described polyalkylene ether-based compound (F), a specific example of $R^{25}$ and $R^{26}$ includes ethylene, n-propylene, isopropylene, n-butylene (tetramethylene), isobutylene group, tert-butylene, straight or branched pentylene [for example, —$CH_2CH_2CH_2CH_2CH_2$—, $CH_2CH_2CH(CH_3)CH_2$—] or the like. $R^{25}$ and $R^{26}$ are preferably ethylene, n-propylene, isoropylene, n-butylene (tetramethylene), n-pentylene, branched pentylene represented by formula: —$CH_2CH_2CH(CH_3)CH_2$—.

In the above-described polyalkylene ether-based compound (F), a specific example of Q and Q' includes a hydrogen atom, methyl, ethyl, propyl, butyl, phenyl, acetyl, benzoyl or the like, particularly, at least one, especially both of Q and Q' preferably represent a hydrogen atom. When a resin composition for optical stereolithography containing a polyalkylene ether-based compound (F) wherein at least one of Q and Q' represents a hydrogen atom is cured upon irradiation with an actinic energy beam, hydroxyl groups at both ends of the polyalkylene ether-based compound (F) react with a cation-polymerizable organic compound, a radical polymerization initiator or the like to make the polyalkylene ether-based compound (F) bonded in the cured resin, providing further enhanced properties such as impact resistance.

In the above-described polyalkylene ether-based compound (F), q and r, which represent a number of repetition of an oxyalkylene unit, are preferably number such that a number average molecular weight of a polyalkylene ether-based compound falls within a range of 500 to 10,000, especially 500 to 5,000.

A preferred example of the above polyalkylene ether-based compound (F) includes polyethylene glycol, polypropylene glycol, polytetramethylene glycol, polyethylene oxide-polypropyleneoxide block copolymer, random copolymer of ethylene oxide and propyleneoxide, a polyether comprising an oxytetramethylene unit having an alkyl substituent (tetramethylene ether unit having an alkyl substituent) represented by formula: —$CH_2CH_2CH(R^8)CH_2O$— (wherein $R^8$ represents a lower alkyl group, preferably methyl or ethyl) connected together, a polyether wherein the above oxytetramethylene unit and the above oxytetramethylene having an alkyl substituent represented by formula —$CH_2CH_2CH(R^{27})CH_2O$— (wherein $R^{27}$ represents a lower alkyl group) are randomly connected, or the like. An island part may consist of one or two or more of the above-described polyalkylene ether-based compound. Among them, a polyether comprising a polytetramethylene glycol and/or tetramethylene ether unit and a tetramethylene ether unit having an alkyl substituent represented by formula —$CH_2CH_2CH(R^{27})CH_2O$— (wherein $R^{27}$ represents a lower alkyl group) connected randomly, whose number average molecular weight falls within the range of 500 to 10,000, is preferably utilized to provide an optical stereolithographic product having low moisture absorption, excellent dimensional stability and stability of properties.

Where the resin composition far optical stereolithography according to the present invention contains a polyalkylene ether-based compound, the content of the polyalkylene ether-based compound is preferably 0.5~30 mass %, more preferably 1~20 mass %, and still more preferably 1~15 mass % based on the total mass of the resin composition for optical stereolithography. It may contain 2 or more polyalkylene ether-based compounds at the same time to the extent not exceeding the above-described content.

The resin composition for optical stereolithography according to the present invention may optionally contain a C4-10 alkylene dial [hereinafter referred to as "alkylene dial (G)"], and a composition containing an alkylene dial (G) will provide a stereolithographic product obtained using the composition with good toughness, and enhanced stereographic performance because it serves as a diluent (viscosity reducing agent).

A C4-10 alkylene diol (G) includes ethyleneglycol, propyleneglycol, butanediol, pentanediol, hexanediol, heptanediol, octanediol, nonanediol, decanediol, and one or two or more of which may be used. Among them, 1,6-hexanediol is preferably used due to photo-curability.

A resin composition for optical stereolithography according to the present invention preferably contains a C4-10 alkylene dial (G) in a ratio of 0.3~10 mass %, more preferably in a ratio of 0.5~5 mass % based on the total mass of the resin composition for optical stereolithography. When it contains too much alkylene diol (G), a stereolithographic product obtained by optical stereolithography exhibit lowered heat deflection temperature and reduced heat resistance, which is not desirable.

The resin composition for optical stereolithography according to the present invention may further contain at least one dye selected from purple and blue dyes [hereinafter referred to as "dye (H)"]. The resin composition for optical stereolithography according to the present invention may optionally contain at least one dye selected from purple and blue dyes (H), and including a properly small amount of at least one dye selected from purple and blue dyes(H) provides a stereolithographic product obtained by optical stereolithography with further lowered yellowness while maintaining high transparency, thus obtaining stereolithographic product exhibiting more excellent colorless transparency.

As a dye (H) selected from purple and blue dyes, any purple dye and/or blue dye may be used so long as it does not reduce photo-curing sensitivity of the resin composition for optical stereolithography and not impair transparency of the resulting stereolithographic product, and includes, for example, Methyl Violet 10B, Methyl Violet 2B (Crystal Violet), purple dye I [1,3-dioxoindan-2-ylidene)(carboxymethyl)(hydroxyoxylatophosphinylmethyl)iminium], Purple 401, Blue 1 (Brilliant blue FCF), Blue 2 (indigo carmine), Potent Blue VI or the like.

The resin composition for optical stereolithography according to the present invention may contain a purple dye alone, or a blue dye alone, or both purple and blue dyes.

Where a resin composition for optical stereolithography contains at least one dye selected from purple and blue dyes (H), the content is preferably 0.02 to 5 ppm, more preferably 0.1 to 1 ppm based on the mass of the resin composition for optical stereolithography. Too much dye (H) provide a stereolithographic product obtained by optical stereolithography exhibiting purple color and hardly turn colorless transparency. On the other hand, using a purple pigment and/or blue pigment instead of a dye (H) selected from a purple dye and blue dye, the stereolithographic product exhibits reduced transparency.

The present resin composition for optical stereolithography may contains, as appropriate, one or two or more of an antifoaming agent, a levelling agent, a thickener, a flame retardant, an antioxidant, a resin for modification, or the like reforming in a proper amount so long as it does not impair the effect of the present invention.

Conducting optical stereolithography using a resin composition for optical stereolithography according to the present invention, any of the conventionally known method and apparatus for optical stereolithography may be used. A representative example of a method for optical stereolithography which may be preferably employed, includes, a method wherein the present resin composition for optical stereolithography in liquid form is selectively irradiated with an actinic energy beam to form a cured layer so that the cured layer can be obtained having a desired pattern thereon. Subsequently, an uncured liquid resin composition for optical stereolithography is supplied onto the cured layer, irradiated with an actinic energy beam in the same manner as described above to newly form a cured layer successively on the above-described cured layer, and then such lamination operation is repeated to finally obtain a targeted stereolithographic product.

An actinic energy beam includes, as described above, UV light, electron beam, X ray, radiation, high frequency ray, or the like. Among them, UV light having wavelength in the range of 300 to 400 nm is preferably used in economic terms. As a source, UV light laser (for example, semiconductor laser excited solid state laser, Ar laser, He—Cd laser, etc.), high pressure mercury lamp, ultra-high mercury lamp, low pressure mercury lamp, xenon lamp, halogen lamp, metal halide lamp, UV LED (light emitting diode), UV fluorescent lamp, or the like may be used.

Where a stereographic surface comprising a resin composition for optical stereolithography is irradiated with an actinic energy beam to form a cured resin layer having a predetermined pattern, a cured resin layer may be formed by stipple or line drawing using a focused actinic energy beam such as laser beam. Alternatively, one may employ a process using a planar drawing mask formed by arranging a plurality of microoptical shutters such as liquid crystal shutter or digital micromirror shutter (DMD), through which an actinic energy beam is irradiated planarly onto a lithographic surface to form a cured resin layer.

The present resin composition for optical stereolithography can be widely utilized in an optical stereolithography field without limitation. A representative application field includes a model for confirmation of shape which is used to validate an external appearance in designing, a model for performance test to check functionality of a component, a master model to fabricate a casting model, a master model to fabricate a metal mold, a direct mold for a trial metal mold, a lens for automobile or motorbike, in the field of fine arts and crafts such as restoration or simulation of art works, contemporary art, as a presentation model for a design of a building covered with glass, as a model, a matrix, or processing of a precision component, an electric and electronic component, furniture, an architectural construction, an automobile component, various kinds of containers, casting, or the like.

EXAMPLE

The present invention will be specifically illustrated in the following examples, but it is not limited thereto.

In the following examples, viscosity of a resin composition for optical stereolithography and mechanical properties[tensile properties (tensile rupture strength, tensile fracture elongation, tensile elastic modulus), bending properties (flexural strength, flexural modulus), impact strength), heat deflection temperature, yellowness and whole light transmittance of the optical stereolithographic product obtained by optical stereolithography using a resin composition for optical stereolithography were measured as follows:

(1) Viscosity of a Resin Composition for Optical Stereolithography:

A resin composition for optical stereolithography was placed in a thermostatic chamber at 25° C. to adjust temperature of the photo-curable resin composition to 25° C., then measurement was conducted using a B-type viscometer (manufactured by TOKYO KEIKI INC.).

(2) Tensile Properties of an Optical Stereolithographic Product (Tensile Rupture Strength, Tensile Fracture Elongation, Tensile Elastic Modulus):

Tensile rupture strength (tensile strength), tensile fracture elongation (tensile elongation) and tensile elastic modulus of a specimen was measured according to JIS K-7113 using an optical stereolithographic product (a dumbbell-shaped specimen according to JIS K-7113) prepared in the following example or comparative example.

(3) Bending Properties of an Optical Stereolithographic Product (Flexural Strength, Flexural Modulus):

Flexural strength and flexural modulus of a specimen was measured according to JIS K 7171 using an optical stereolithographic product (a bar-shaped specimen according to JIS K-7171) prepared in the following example or comparative example.

(4) Impact Strength of an Optical Stereolithographic Product:

Notched Izod impact strength was measured according to JIS K-7110 using a digital impact tester "model DG-18" manufactured by TOYO SEIKI CO. LTD.

(5) Heat Deflection Temperature of an Optical Stereolithographic Product:

Heat deflection temperature of a specimen was measured using an optical stereolithographic product (a bar-shaped specimen according to JIS K-7171) manufactured in the following example or comparative example, "HDT TESTER 6M-2" manufactured by TOYO SEIKI CO., LTD, and applying 1.81 MPa load to the specimen according to JIB K-7207 (Method A). Heat deflection temperature of the specimen was measured according to JIS K-7207 (Method B) further applying 0.45 MPa load to the specimen.

(6) Yellowness of an Optical Stereolithographic Product:

Yellow index (YI) defined in JIS K7373 was obtained by color analysis using a ultraviolet and visible spectrophotometer "UV-3900H" manufactured by Hitachi High-Technologies Corporation and taken as yellowness of the optical stereolithographic product.

(7) Whole Light Transmittance of the Optical Stereolithographic Product:

An ultraviolet and visible spectrophotometer "UV-3900H" manufactured by Hitachi High-Technologies Corporation was used to measure double-beam standard illuminant D65 spectral transmittance.

Example 1

(1) 3,4-epoxycyclohexylmethyl-3',4'-epoxycyclohexane carboxylate ("Cel-2021P" manufactured by DAICEL CORPORATION), 6.5 parts by mass, hydrogenated bisphenol A diglycidylether ("HBE-100" manufactured by New Japan Chemical Co., Ltd.), 30 parts by mass, an aromatic triglycidylether compound (A-2b) represented by the above chemical formula (A-21b) [2-[4-(2,3-epoxypropoxy)phenyl]-2-[4-[1,1-bis[4-([2,3-epoxypropoxy]phenyl]ethyl]phenyl]propane] ("VG3101L" manufactured by Printech co., ltd.), 30 parts by mass, 3-ethyl-3-hydroxymethyloxetane ("OXT101" manufactured by TOAGOSEI CO. LTD.) 7.5 parts by mass, bis(-ethyl-(3-oxetanylmethyl)ether "OXT221" manufactured by TOAGOSEI CO., LTD.) 15 parts by mass, 1,6-hexanediol diglycidylether ("EX-212" manufactured by Nagase ChemteX Corporation) 3 parts by mass, dipentaerythritol pentaacrylate ("A-9550W" manufactured by Shin Nakamura Chemical Co., Ltd.) 10 parts by mass, lauryl acrylate ("NKester-LA" manufactured by Shin Nakamura Chemical Co., Ltd.) 8 parts by mass, polytetramethylene ether glycol ("PTG-850SN" manufactured by HODOGAYA CHEMIDCAL CO., LTD., number average molecular weight 801 to 890) 1.5 parts by mass, 1,6-hexanediol 0.8 parts by mass, "CPI-200K", manufactured by SAN-APRO LIMITED [corresponding to aromatic sulfonium compound (C-1); a cationic polymerization initiator solution containing a compound represented by the following formula (α) at a concentration of 50 mass %] 3.5 parts by mass, 1-hydroxy-cyclohexylphenylketone ("IRGACURE-184" manufactured by Ciba Specialty Chemicals, a radical polymerization initiator) 2.5 parts by mass, and 2-naphthalenethiol 0.025 parts by mass were mixed thoroughly to prepare a resin composition for optical stereolithography. Viscosity of this resin composition for optical stereolithography was measured to be 604 mPa·s according to the above method.

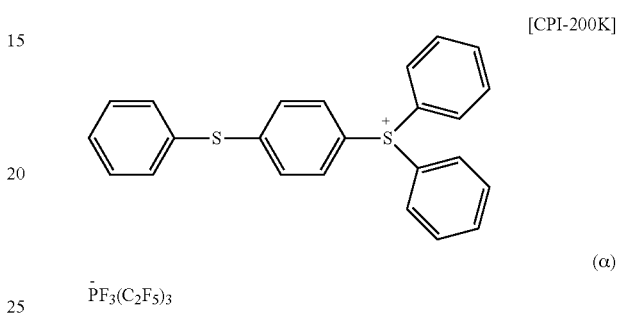

[CPI-200K]

(α)

$\bar{P}F_3(C_2F_5)_3$ (2) Using the resin composition for optical stereolithography obtained in the above (1) and a ultra-high speed optical stereolithography system ("SOLIFORM500" manufactured by Nabtesco Corporation), optical stereolithography was conducted with a semiconductor laser (rated output, 400 mW; wavelength, 355 nm; manufactured by Spectra-Physics K.K.) under conditions of surface irradiation energy of 100 mJ/cm², at slice pitch of 0.10 mm, and average stereolithographic time of 2 minutes/layer to prepare specimens for measurement of physical properties (a dummbell-shaped specimen according to JIS K-7113 and a bar-shaped specimen according to JIS K-7171, a specimen for measurement of Izod impact strength test according to JIS K-7110), a specimen for measurement of yellowness, whole light transmittance, with thickness of 5 mm. The obtained specimens were heated at 100° C. for 2 hours to post-cure.

The specimen after post-curing was used for measurement of mechanical properties, heat deflection temperature, yellowness, and whole light transmittance by the above-described method. The results are shown in Table 1 below.

Example 2

(1) A resin composition for optical stereolithography was prepared in the same manner as in Example 1 (1), except that Methyl Violet 10B ("Crystal Violet" manufactured by Wako Pure Chemical Industries, Ltd.) 2.5×10⁻⁵ parts by mass (based on the mass of a resin composition for optical stereolithography, 0.21 ppm) was further added in Example 1 (1). Viscosity of thus obtained resin composition for optical stereolithography was measured to be 608 mPa·s by the above-described method.

(2) Using the resin composition for optical stereolithography obtained in the above (1), a specimen for measurement of physical properties was prepared in the same manner as in Example 1 (2), and the resulting specimen was heated at 100° C. for 2 hours to post-cure. Mechanical properties, heat deflection temperature, yellowness and whole light transmittance of the specimen after post-curing were measured by the above-described method.

The results are shown in Table 1 below.

Example 3

(1) A resin composition for optical stereolithography was prepared in the same manner as in Example 1 (1), except that the added amount of 1,6-hexanediol diglycidylether was changed to 2.0 parts by mass, the added amount of polytetramethylene ether glycol was changed to 2.0 parts by mass, and the added amount of 1,6-hexanediol was changed to 2.0 parts by mass in Example 1 (1). Viscosity of thus obtained resin composition for optical stereolithography was measured to be 604 mPa·s by the above-described method.

(2) Using the resin composition for optical stereolithography obtained in the above (1), a specimen for measurement of physical properties was prepared in the same manner as in Example 1 (2), and the resulting specimen was heated at 100° C. for 2 hours to post-cure.

Mechanical properties, heat deflection temperature, yellowness and whole light transmittance of the specimen after post-curing were measured by the above-described method.

The results are shown in Table 1 below.

Comparative Example 1

(1) 3,4-Epoxy cyclohexylmethyl-3',4'-epoxy cyclohexane carboxylate ("Cel-2021P" manufactured by DAICEL CORPORATION) 6.5 parts by mass, hydrogenated bisphenol A diglycidylether("HBE-100" manufactured by New Japan Chemical Co., Ltd.) 60 parts by mass, 3-ethyl-3-hydroxymethylxetane ("OXT101" manufactured by TOAGOSEI CO., LTD.) 7.5 parts by mass, bis(3-ethyl-3-oxetanylmethyl)ether ("OXT221" manufactured by TOAGOSEI CO, LTD.) 15 parts by mass, dipentaerythritol pentaacrylate ("A-9550W" manufactured by Shin Nakamura Chemical Co., Ltd.) 10 parts by mass, lauryl acrylate ("NKester-LA" manufactured by Shin Nakamura Chemical Co., Ltd) 8 parts by mass, "CPI-200K", manufactured by SAN-APRO LIMITED [corresponding to aromatic sulfonium compound (C-1); a cationic polymerization initiator solution containing a compound represented by the following formula (α) at a concentration of 50 mass %] 3.5 parts by mass and 1-hydroxy-cyclohexylphenylketone ("IRGACURE-184" manufactured by Ciba Specialty Chemicals, a radical polymerization initiator) 2.5 parts by mass were mixed thoroughly to prepare a resin composition for optical stereolithography. Viscosity of this resin composition for optical stereolithography was measured to be 200 mPa·s by the above-described method.

(2) Using the resin composition for optical stereolithography obtained in the above (1), a specimen for measurement of physical properties was prepared in the same manner as in Example 1 (2), and the resulting specimen was heated at 100° C. for 2 hours to post-cure.

Mechanical properties, heat deflection temperature, yellowness and whole light transmittance of the specimen after post-curing were measured by the above-described method.

The results are shown in Table 1 below.

Comparative Example 2

(1) A resin composition for optical stereolithography was prepared in the same manner as in Example 1 except that 2-naphthalenethiol was not added in Example 1 (1). Viscosity of thus obtained resin composition for optical stereolithography was measured to be 638 mPa·s by the above-described method.

(2) Using the resin composition for optical stereolithography obtained in the above (1), a specimen for measurement of physical properties was prepared in the same manner as in Example 1 (2), and the resulting specimen was heated at 100° C. for 2 hours to post-cure.

Mechanical properties, heat deflection temperature, yellowness and whole light transmittance of the specimen after post-curing were measured by the above-described method.

The results are shown in Table 1 below

TABLE 1

|  | Example | | | Comparative Example | |
|---|---|---|---|---|---|
|  | 1 | 2 | 3 | 1 | 2 |
| Resin composition for optical stereolithography (parts by mass) | | | | | |
| Cation polymerizable organic compound: 3,4-epoxycyclohexylmethyl-3',4'-epoxy-cyclohexane carboxylate | 6.5 | 6.5 | 6.5 | 6.5 | 6.5 |
| Hydrogenated bisphenol A diglycidyl ether | 30 | 30 | 30 | 60 | 30 |
| Aromatic triglycidyl ether compound (A-2b) | 30 | 30 | 30 | — | 30 |
| 3-ethyl-3-hydroxymethyloxetane | 7.5 | 7.5 | 7.5 | 7.5 | 7.5 |
| Bis(3-ethyl-3-oxetanylmethyl)ether | 15 | 15 | 15 | 15 | 15 |
| 1,6-hexanediol diglycidyl ether | 3 | 3 | 3 | 3 | 3 |
| Radical polymerizable organic compound: | | | | | |
| Dipentaerythritol pentaacrytate | 10 | 10 | 10 | 10 | 10 |
| Lauryl acrylate | 8 | 8 | 8 | 8 | 8 |
| Polytetramethylene ether glycol | 1.5 | 1.5 | 2 | — | 1.5 |
| 1,6-hexanediol | 0.8 | 0.8 | 2 | — | 0.8 |
| Cation polymerization initiator: "CPI-200K" manufactured by SAN-APRO LIMITED [aromatic sulfonium compound (C-1), formula (α)] | 3.5 | 3.5 | 3.5 | 3.5 | 3.5 |
| Radical polymerization initiator: 1-hydroxy-cyclohexylphenylketone | 2.5 | 2.5 | 2.5 | 2.5 | 2.5 |

TABLE 1-continued

|  | Example | | | Comparative Example | |
| --- | --- | --- | --- | --- | --- |
|  | 1 | 2 | 3 | 1 | 2 |
| Aromatic thiol compound: 2-naphthalene thiol | 0.025 | 0.025 | 0.025 | — | — |
| Violet dye: Methyl Violet 10B | — | $2.1 \times 10^{-5}$ | — | — | — |
| Physical properties of stereolithographic product |  |  |  |  |  |
| Tensile rupture strength (MPa) | 57 | 50 | 53 | 46 | 56 |
| Tensile rupture elongation (%) | 5.8 | 6.0 | 11.0 | 5.3 | 7.1 |
| Tensile elastic modulus (MPa) | 1680 | 1760 | 1550 | 1640 | 1700 |
| Flexural strength (MPa) | 86 | 81 | 70 | 65 | 78 |
| Flexural modulus (MPa) | 2260 | 2150 | 1950 | 2050 | 2090 |
| Izod Impact strength (J/m) | 17 | 15 | 13 | 11 | 14 |
| Heat deflection temperature |  |  |  |  |  |
| Low load (method B) (° C.) | 120 | 117 | 85 | 70 | 119 |
| High load (method A) (° C.) | 97 | 96 | 60 | 54 | 100 |
| Yellowness | 11 | 7 | 14 | 22 | 17 |
| Whole light transmittance (%) | 89 | 86 | 85 | 80 | 85 |

1) Aromatic triglycidylether compound (A-2b) represented by the chemical formula (A-2b)

As shown in the above table 1, resin compositions for optical stereolithography of Examples 1 to 3, wherein a naphthalenethiol which is a kind of aromatic thiol compound (E) as well as a cationic polymerization initiator comprising an aromatic sulfonium compound (C-1) are included in a resin composition for optical stereolithography containing a cation-polymerizable organic compound (A), a radical polymerizable organic compound (B), a cationic polymerization initiator (C), and a radical polymerization initiator (D), provides a stereolithographic product obtained by optical stereolithography exhibiting low yellowness, high whole light transmittance, excellent colorless transparency. In particular, a stereolithographic product obtained using a resin composition for optical stereolithography of Example 2 which further contains a purple dye has lower yellowness while maintaining high whole light transmittance of 86%, and is excellent in colorless transparency.

On the other hand, resin compositions for optical stereolithography of Comparative Example 1 and 2, which contains a cationic polymerization initiator comprising an aromatic sulfonium compound (C-1) solely without an aromatic thiol compound (E), a stereolithographic product obtained by optical stereolithography has higher yellowness compared with those of Examples 1 to 3, and exhibit inferior color exhibiting yellow.

Example 4

(1) 3,4-Epoxy cyclohexylmethyl-3',4'-epoxy cyclohexane carboxylate ("Cel-2021P" manufactured by DAICEL CORPORATION) 2.2 parts by mass, hydrogenated bisphenol A diglycidylether ("HBE-100" manufactured by New Japan Chemical Co Ltd.) 54 parts by mass, 3-ethyl-3-hydroxymethylxetane ("OXT101" manufactured by TOAGOSEI CO., LTD.) 4.5 parts by mass, bis(3-ethyl-3-oxetanylmethyl)ether ("OXT221" manufactured by TOAGOSEI CO., LTD) 14 parts by mass, dipentaerythritol pentaacrylate ("A-9550W" manufactured by Shin Nakamura Chemical Co., Ltd.) 11 parts by mass, lauryl acrylate ("NKester-LA" manufactured by Shin Nakamura Chemical Co., Ltd.) 7 parts by mass, "CPI-2001K", manufactured by SAN-APRO LIMITED [corresponding to aromatic sulfonium compound (C-1); a solution of a cationic polymerization initiator containing a compound represented by the above formula (α) at a concentration of 50 mass %] 4.5 parts by mass, 1-hydroxycyclohexylphenylketone ("IRGACURE-184" manufactured by Ciba Specialty Chemicals, a radical polymerization initiator) 2.3 parts by mass, 2-naphthalenethiol 0.1 parts by mass and water 0.5 parts by mass were mixed thoroughly to prepare a resin composition for optical stereolithography.

(2) Using the resin composition for optical stereolithography obtained in the above (1), a specimen for measurement of physical properties was prepared in the same manner as in Example 1 (2), except that a specimen of 10 mm thickness was prepared for measurement of yellowness and whole light transmittance. The obtained specimen was irradiated with UV light (metal halide lamp; wavelength, 365 nm; intensity; $3.0 \, mW/cm^2$) for 20 minutes to post-cure. The obtained specimen was irradiated with UV light (metal halide lamp; wavelength, 365 nm; intensity; $3.0 \, mW/cm^2$) for 20 minutes to post-cure.

Mechanical properties, heat deflection temperature, yellowness (immediately after post-curing and after heating at 60° C. for 24 hours) and whole light transmittance (immediately after post-curing and after heating at 60° C. for 24 hours) were measured according to the above method.

The results are shown in Table 2 below.

Comparative Example 3

(1) A resin composition for optical stereolithography was prepared in the same manner as in Example 4 (1), except that 2-naphthalenethiol was not added.

(2) Using the resin composition for optical stereolithography obtained in the above (1), a specimen for measurement of physical properties was prepared in the same manner as in Example 1 (2), except that a specimen of 10 mm thickness was prepared for measurement of yellowness and whole light transmittance. The obtained specimen was irradiated with UV light (metal halide lamp; wavelength, 365 nm; intensity; $3.0 \, mW/cm^2$) for 20 minutes to post-cure.

Mechanical properties, heat deflection temperature, yellowness (immediately after post-curing and after heating at 60° C. for 24 hours) and whole light transmittance (immediately after post-curing and after heating at 60° C. for 24 hours) were measured according to the above method.

The results are shown in Table 2 below.

Comparative Example 4

(1) A resin composition for optical stereolithography was prepared in the same manner as in Example 4 (1), except that 0.1 parts by mass of diphenyldisulfide was added instead of 0.1 parts by mass of 2-naphthalenethiol.

(2) Using the resin composition for optical stereolithography obtained in the above (1), a specimen for measurement of physical properties was prepared in the same manner as in Example 1 (2), except that a specimen of 10 mm thickness was prepared for measurement of yellowness and whole light transmittance. The obtained specimen was radiated with UV light (metal halide lamp; wavelength, 365 nm; intensity; 3.0 mW/cm$^2$) for 20 minutes to post-cure.

Mechanical properties, heat deflection temperature, yellowness (immediately after post-curing and after heating at 60° C. for 24 hours) and whole light transmittance (immediately after post-curing and after heating at 60° C. for 24 hours) were measured according to the above method.

The results are shown in Table 2 below.

Comparative Example 5

(1) A resin composition for optical stereolithography was prepared in the same manner as in Example 4 (1), except that 0.1 parts by mass of mercaptothiazole was added instead of 0.1 parts by mass of 2-naphthalenethiol.

(2) Using the resin composition for optical stereolithography obtained in the above (1), a specimen for measurement of physical properties was prepared in the same manner as in Example 1 (2), except that a specimen of 10 mm thickness was prepared for measurement of yellowness and whole light transmittance. The obtained specimen was radiated with UV light (metal halide lamp; wavelength, 365 nm; intensity; 3.0 mW/cm$^2$) for 20 minutes to post-cure.

Mechanical properties, heat deflection temperature, yellowness (immediately after post-curing and after heating at 60° C. for 24 hours) and whole light transmittance (immediately after post-curing and after heating at 60° C. for 24 hours) were measured according to the above method.

The results are shown in Table 2 below.

Reference Example 1

(1) A resin composition for optical stereolithostereolithography was prepared in the same manner as in Example 4 (1), except that 4.5 parts by mass of "CPI-101A" manufactured by SAN-APRO LIMITED an antimony-based cationic polymerization initiator, manufactured by SAN-APRO LIMITED, a solution containing an antimony compound represented by the following chemical formula (β) at a concentration of 50 mass %] was added as a cationic polymerization initiator instead of 4.5 parts by mass of CPI-200K and 2-naphthalenethiol was not added.

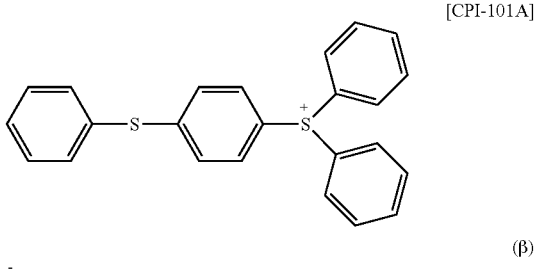

[CPI-101A]

(β)

$\bar{SbF_6}$ (2) Using the e n composition for optical stereolithography obtained in the above (1), a specimen for measurement of physical properties was prepared in the same manner as in Example 1 (2), except that a specimen of 10 mm thickness was prepared for measurement of yellowness and whole light transmittance. The obtained specimen was irradiated with UV light (metal halide lamp; wavelength, 365 nm; intensity; 3.0 mW/cm$^2$) for 20 minutes to post-cure.

Mechanical properties, heat deflection temperature, yellowness (immediately after post-curing and after heating at 60° C. for 24 hours) and whole light transmittance (immediately after post-curing and after heating at 60° C. for 24 hours) were measured according to the above method.

The results are shown in Table 2 below.

TABLE 2

|  | Ex. 4 | Com. Ex. 3 | Com. Ex. 4 | Com. Ex. 5 | Ref. Ex. 1 |
|---|---|---|---|---|---|
| Resin composition for optical stereolithography (parts by mass) | | | | | |
| Cation polymerizable organic compound: 3,4-epoxycyclohexylmethyl-3',4'-epoxy-cyclohexane carboxylate | 2.2 | 2.2 | 2.2 | 2.2 | 2.2 |
| Hydrogenated bisphenol A diglycidyl ether | 54 | 54 | 54 | 54 | 54 |
| 3-ethyl-3-hydroxymethyloxetane | 4.5 | 4.5 | 4.5 | 4.5 | 4.5 |
| Bis(3-ethyl-3-oxetanylmethyl)ether | 14 | 14 | 14 | 14 | 14 |
| Radical polymerizable organic compound: Dipentaerythritol pentaacrylate | 11 | 11 | 11 | 11 | 11 |
| Lauryl acrylate | 7 | 7 | 7 | 7 | 7 |
| Cation polymerization initiator: | | | | | |
| "CPI-200K" manufactured by SAN-APRO LIMITED [aromatic sulfonium compound (C-1), formula (α)] | 4.5 | 4.5 | 4.5 | 4.5 | — |
| "CPI-101A" manufactured by SAN-APRO LIMITED [antimony-based cationic polymerization initiator, formula β)] | — | — | — | — | 4.5 |

TABLE 2-continued

|  | Ex. 4 | Com. Ex. 3 | Com. Ex. 4 | Com. Ex. 5 | Ref. Ex. 1 |
|---|---|---|---|---|---|
| Radical polymerization initiator: 1-hydroxy-cyclohexylphenylketone | 2.3 | 2.3 | 2.3 | 2.3 | 2.3 |
| Sulfur compound: 2-naphthelenethiol | 0.1 | — | — | — | — |
| Diphenyl disulfide | — | — | 0.1 | — | — |
| Mercaptothiazole | — | — | — | 0.1 | — |
| Water | 0.5 | 0.5 | 0.5 | 0.5 | 0.5 |
| Physical properties of stereolithographic product | | | | | |
| Tensile rupture strength (MPa) | 48 | 45 | 44 | 46 | 46 |
| Tensile rupture elongation (%) | 6.8 | 6.2 | 6.5 | 5.6 | 6.7 |
| Tensile elastic modulus (MPa) | 1700 | 1620 | 1620 | 1650 | 1690 |
| Flexural strength (MPa) | 72 | 71 | 71 | 55 | 70 |
| Flexural modulus (MPa) | 2420 | 2110 | 2110 | 1730 | 2030 |
| Izod impact strength (J/m) | 18 | 19 | 19 | 14 | 18 |
| Heat deflection temperature | | | | | |
| Low load (method B) (° C.) | 53 | 57 | 57 | 48 | 57 |
| High load (method A) (° C.) | 50 | 51 | 51 | 44 | 52 |
| Yellowness | | | | | |
| Immediately after UV curing | 9 | 12 | 13 | 10 | 9 |
| After heating at 60° C. for 24 hours | 8 | 34 | 31 | 12 | 12 |
| Whole light transmittance (%) | | | | | |
| Immediately after UV curing | 88 | 87 | 89 | 89 | 89 |
| After heating at 60° C. for 24 hours | 83 | 83 | 81 | 90 | 88 |

As shown in the above Table 2, a resin composition for optical stereolithography of Example 4, wherein a naphthalenethiol which is a kind of aromatic thiol compound (E) as well as a cationic polymerization initiator comprising an aromatic sulfonium compound (C-1) are included in a resin composition for optical stereolithography containing a cation-polymerizable organic compound (A), a radical polymerizable organic compound (B), a cationic polymerization initiator (C), and a radical polymerization initiator (D), provides a stereolithographic product obtained by optical stereolithography which exhibits low yellowness, high whole light transmittance, excellent colorless transparency, and yellowness after heating at 60° C. for 24 hours is superior to that of a stereolithographic product obtained by optical stereolithography using a resin composition for optical stereolithography of Reference Example 1 which contains an antimony-based cationic polymerization initiator (CPI-101A).

On the other hand, a resin composition for optical stereolithography of Comparative Example 3, which does not contain an aromatic thiol compound (E) but a cationic polymerization initiator comprising an aromatic sulfonium compound (C-1) alone, a resin composition for optical stereolithography of Comparative Example 4, which contains, instead of an aromatic thiol compound (E), a diphenyldisulfide, or a resin composition for optical stereolithography of Comparative Example 5, which contains mercaptothiazole instead of an aromatic thiol compound (E) produces a stereolithographic product by stereolithography which has higher yellowness relative to that of Example 4. In particular, Comparative Examples 3 and 4 exhibit drastically increased yellowness after heating at 60° C. for 24 hours relative to that of Example 4. Comparative Example 5 exhibits inferior heat deflection temperature, strength, and impact resistance, and reduced reactivity, relative to those in Example 4.

Example 5

(1) 3,4-epoxy cyclohexylmethyl-3',4'-epoxy cyclohexane carboxylate ("Cel-2021P" manufactured by DAICEL CORPORATION) 50 parts by mass, diglycidylether of propyleneoxide (2 mole) adduct of bisphenol A ("BPO-20E", manufactured by New Japan Chemical Co., Ltd.) 10 parts by mass, 3-ethyl-3-hydroxymethylxetane ("OXT101" manufactured by TOAGOSEI CO., LTD.) 10 parts by mass, tricyclodecanedimethanol diacrylate ("A-DCP" manufactured by Shin Nakamura Chemical Co., Ltd.) 13.5 parts by mass, propoxylated pentaerythritol tetraacrylate ("ATM-4P" manufactured by Shin Nakamura Chemical Co., Ltd.) 9 parts by mass, "CPI-200K", manufactured by SAN-APRO LIMITED [corresponding to aromatic sulfonium compound (C-1); a solution of a cationic polymerization initiator containing a compound represented by the above formula (α) at a concentration of 50 mass %] 5 parts by mass, 1-hydroxy-cyclohexylphenylketone ("IRGACURE-184" manufactured by Ciba Specialty Chemicals, a radical polymerization initiator) 2.5 parts by mass and 2-naphthalenethiol 0.1 parts by mass were mixed thoroughly to prepare a resin composition for optical stereolithography.

(2) Using the resin composition for optical stereolithography obtained in the above (1), a specimen for measurement of physical properties was prepared in the same manner as in Example 1 (2), except that a specimen of 10 mm thickness was prepared for measurement of yellowness and whole light transmittance. The obtained specimen was irradiated with UV light (metal halide lamp; wavelength, 365 nm; intensity; 3.0 mW/cm$^2$) for 20 minutes to post-cure.

Mechanical properties, heat deflection temperature, yellowness (immediately after post-curing and after heating at 60° C. for 24 hours) and whole light transmittance (immediately after post-curing and after heating at 60° C. for 24 hours) were measured according to the above method.

The results are shown in Table 3 below.

Comparative Example 6

(1) A resin composition for optical stereolithography was prepared in the same manner as in Example 5 (1), except that 2-naphthalenethiol was not added.

(2) Using the resin composition for optical stereolithography obtained in the above (1), a specimen for measurement of physical properties was prepared in the same manner as in Example 1 (2), except that a specimen of 10 mm thickness was prepared for measurement of yellowness and whole light transmittance. The obtained specimen was irradiated with UV light (metal halide lamp; wavelength, 365 nm; intensity; 3.0 mW/cm$^2$) for 20 minutes to post-cure.

Mechanical properties, heat deflection temperature, yellowness (immediately after post-curing and after heating at 60° C. for 24 hours) and whole light transmittance (immediately after post-curing and after heating at 60° C. for 24 hours) were measured according to the above method.

The results are shown in Table 3 below.

Example 6

(1) 3,4-epoxy cyclohexylmethyl-3',4'-epoxy cyclohexane carboxylate ("Cel-2021P" manufactured by DAICEL CORPORATION) 65 parts by mass, ethoxylated pentaerythritol tetraacrylate ("ATM-4E" manufactured by Shin Nakamura Chemical Co., Ltd.), 7 parts by mass, an acrylic acid adduct of bisphenol A diglycidylether ("VR-77" manufactured by Showa Denko K.K.) 5 parts by mass, "CPI-200K", manufactured by SAN-APRO LIMITED [corresponding to aromatic sulfonium compound (C-1); a solution of a cationic polymerization initiator containing a compound represented by the above formula (α) at a concentration of 50 mass %] 5 parts by mass, 1-hydroxy-cyclohexylphenylketone ("IRGACURE-184" manufactured by Ciba Specialty Chemicals, a radical polymerization initiator) 2 parts by mass and 2-naphthalenethiol 0.75 parts by mass were mixed thoroughly to prepare a resin composition for optical stereolithography.

(2) Using the resin composition for optical stereolithography obtained in the above (1), a specimen for measurement of physical properties was prepared in the same manner as in Example 1 (2), except that a specimen of 10 mm thickness was prepared for measurement of yellowness and whole light transmittance. The obtained specimen was irradiated with UV light (metal halide lamp; wavelength, 365 nm; intensity; 3.0 mW/cm$^2$) for 20 minutes to post-cure.

Mechanical properties, heat deflection temperature, yellowness (immediately after post-curing and after heating at 60° C. for 24 hours) and whole light transmittance (immediately after post-curing and after heating at 60° C. for 24 hours) were measured according to the above method.

The results are shown in Table 3 below.

Comparative Example 7

(1) A resin composition for optical stereolithography was prepared in the same manner as in Example 6 (1), except that 2-naphthalenethiol was not added.

(2) Using the resin composition for optical stereolithography obtained in the above (1), a specimen for measurement of physical properties was prepared in the same manner as in Example 1 (2), except that a specimen of 10 mm thickness was prepared for measurement of yellowness and whole light transmittance. The obtained specimen was irradiated with UV light (metal halide lamp; wavelength, 365 nm; intensity; 3.0 mW/cm$^2$) for 20 minutes to post-cure.

Mechanical properties, heat deflection temperature, yellowness (immediately after post-curing and after heating at 60° C. for 24 hours) and whole light transmittance (immediately after post-curing and after heating at 60° C. for 24 hours) were measured according to the above method.

The results are shown in Table 3 below.

TABLE 3

|  | Ex. 5 | Com. Ex. 6 | Ex. 7 | Com. Ex. 7 |
|---|---|---|---|---|
| Resin composition for optical stereolithography (parts by mass) |  |  |  |  |
| Cation polymerizable organic compound: 0 3,4-epoxycyclohexylmethyl-3',4'-epoxy-cylohexane carboxylate | 50 | 50 | 65 | 65 |
| Radical polymerizable organic compound: |  |  |  |  |
| Tricyclodecanedimethanol diacrylate | 13.5 | 13.5 | — | −1 |
| Propoxylated pentaerythritol tetraacrylate | 9 | 9 | — | — |
| Ethoxylated pentaerythritol tetraacrylate | — | — | 7 | 7 |
| Acrylic acid adduct of bisphenol A diglycidyl ether | — | — | 5 | 5 |
| Cation polymerization initiator: "CPI-200K" manufactured by SAN-APRO LIMITED [aromatic sulfonium compound (C-1), formula (α)] | 5 | 5 | 5 | 5 |
| Radical polymerization initiator: 1-hydroxy-cyclohexylphenylketone | 2.5 | 2.5 | 2 | 2 |
| Sulfur compound 2-naphthelenethiol | 0.1 | — | 0.75 | — |
| Physical properties of stereolithographic product |  |  |  |  |
| Tensile rupture strength (MPa) | 68 | 71 | 69 | 71 |
| Tensile rupture elongation (%) | 4.2 | 4.1 | 5.3 | 6.2 |

TABLE 3-continued

|  | Ex. 5 | Com. Ex. 6 | Ex. 7 | Com. Ex. 7 |
|---|---|---|---|---|
| Tensile elastic modulus (MPa) | 2430 | 2390 | 2270 | 2160 |
| Flexural strength (MPa) | 110 | 115 | 100 | 102 |
| Flexural modulus (MPa) | 3090 | 3360 | 3270 | 3160 |
| Izod impact strength (J/m) | 17 | 19 | 14 | 15 |
| Heat deflection temperature |  |  |  |  |
| Low load (method B) (° C.) | 70 | 73 | 66 | 67 |
| High load (method A) (° C.) | 56 | 59 | 56 | 58 |
| Yellowness |  |  |  |  |
| Immediately after UV curing | 11 | 14 | 12 | 16 |
| After heating at 60° C. for 24 hours | 10 | 35 | 11 | 36 |
| Whole light transmittance (%) |  |  |  |  |
| Immediately after UV curing | 86 | 82 | 86 | 82 |
| After heating at 60° C. for 24 hours | 86 | 78 | 87 | 75 |

Example 7

(1) Except for adding 0.1 mass part of dimercaptodiphenysulfide instead of 0.1 mass part of 2-naphthalenethiol, a resin composition for optical stereolithography was prepared in the same manner as in Example 4 (1).

(2) Using a resin composition for optical stereolithography obtained in the above (1), a specimen of 10 mm thickness was prepared for measurement of yellowness and whole light transmittance in the same manner as in Example 1 (2). The obtained specimen was irradiated with UV light (metal halide lamp; wavelength, 365 nm; intensity; 3.0 mW/cm$^2$) for 20 minutes to post-cure.

Yellowness (immediately after curing) and whole light transmittance (immediately after post-curing) as measured according to the method described above.

As the result, yellowness was 6, and whole light transmittance was 90%.

INDUSTRIAL APPLICABILITY

The resin composition for optical stereolithography according to the present invention does not include a toxic antimony-based cationic polymerization initiator but includes, as cationic polymerization initiator (C), an aromatic sulfonium compound (C-1) which is a phosphorous-based aromatic sulfonium salt, and further includes aromatic thiol compound (E). This composition is extremely useful as a resin composition for optical stereolithography, because it is safe and exhibits excellent handling properties, and further gives a stereolithographic product exhibiting excellent color tone which is equivalent to or close to colorless transparency.

The invention claimed is:

1. A resin composition for optical stereolithography including a cation-polymerizable organic compound (A), a radical polymerizable organic compound (B), a cationic polymerization initiator (C) and a radical polymerization initiator (D);

wherein the cationic polymerization initiator (C) is an aromatic sulfonium compound (C-1) represented by the following general formula (C-1):

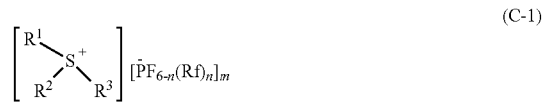

(C-1)

wherein R$^1$, R$^2$, and R$^3$ represent a monovalent organic group, Rf represents a fluoroalkyl group, m is the same number as the cationic charge of the "cation [S$^+$(R$^1$)(R$^2$)(R$^3$)]", and n is an integer in a range of 0 to 6; and wherein the resin composition further includes an aromatic thiol compound (E) represented by the following general formula (E):

$$R^4\text{---}(SH)_p \qquad (E)$$

wherein R$^4$ represents a mono- or di-valent aromatic hydrocarbon which may optionally have a substituent, and p is an integer of 1 or 2, and wherein a content of the aromatic thiol compound (E) is in a range of 0.1 to 5 mass % based on a mass of the aromatic sulfonium compound (C-1).

2. The resin composition for optical stereolithography according to claim 1, wherein R$^1$, R$^2$, and R$^3$ in the above general formula (C-1) each independently represent a monovalent aromatic group whose aromatic ring may have a substituent attached thereto, the monovalent aromatic group having 1 or 2 or more bond(s) selected from the group consisting of bonds represented by the formulae: —S—, —SO—, —O—, and —CO—.

3. The resin composition for optical stereolithography according to claim 1, wherein R$^1$, R$^2$, and R$^3$ in the above general formula (C-1) each independently represent any one group represented by the following general formulae <1> to <11>:

(1)

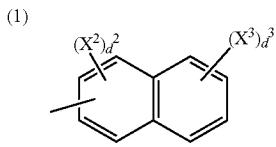

(2)

-continued

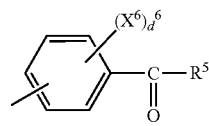
(3)

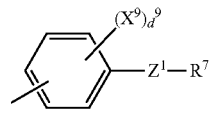
(4)

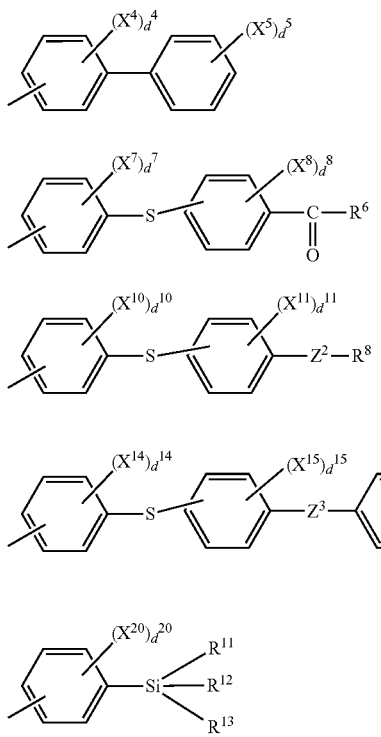
(5)

(7)

(9)

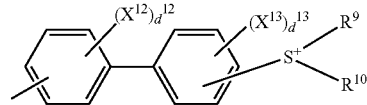
(6)

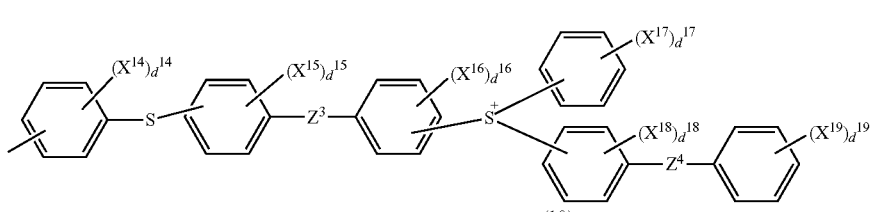
(8)

(10)

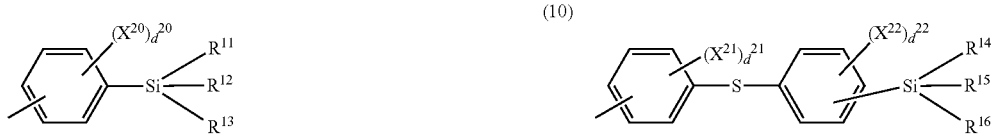
(11)

wherein $R^5$, $R^6$, $R^7$, $R^8$, $R^9$, $R^{10}$, $R^{11}$, $R^{12}$, $R^{13}$, $R^{14}$, $R^{15}$, and $R^{16}$ each independently represent an alkyl or aryl group which may have a substituent; $X^1$, $X^2$, $X^3$, $X^4$, $X^5$, $X^6$, $X^7$, $X^8$, $X^9$, $X^{10}$, $X^{11}$, $X^{12}$, $X^{13}$, $X^{14}$, $X^{15}$, $X^{16}$, $X^{17}$, $X^{18}$, $X^{19}$, $X^{20}$, $X^{21}$, and $X^{22}$ each independently represent a group selected from an alkyl group, an aryl group, an alkoxy group, an aryloxy group, a hydroxy(poly)alkyleneoxy group, a hydroxyl group, a cyano group, a nitro group, and a halogen atom; $Z^1$, $Z^2$, $Z^3$, and $Z^4$, each independently represent a divalent group selected from formula: —S—, —SO—, and —O—, $d^1$ independently represents an integer in the range of 0 to 5; $d^2$, $d^3$, and $d^4$ each independently represents an integer in the range of 0 to 4; $d^5$ independently represents an integer in the range of 0 to 5; $d^6$, $d^7$, $d^8$, $d^9$, $d^{10}$, $d^{11}$, $d^{12}$, $d^{13}$, $d^{14}$, $d^{15}$, and $d^{16}$ each independently represents an integer in the range of 0 to 4; $d^{17}$ independently represents an integer in the range of 0 to 5; $d^{18}$ independently represents an integer in the range of 0 to 4; $d^{19}$ independently represents an integer in the range of 0 to 5; and $d^{20}$, $d^{21}$, and $d^{22}$ each independently represent an integer in the range of 0 to 4.

4. The resin composition for optical stereolithography according to claim 1, which contains an oxetane compound in an amount of 1 to 35 mass % based on the mass of the cation-polymerization compound (A).

5. The resin composition for optical stereolithography according to claim 1, wherein the content ratio of the cation-polymerizable organic compound (A): the radical polymerizable organic compound (B) is 30:70 to 90:10 (by mass), the composition containing a cationic polymerization initiator (C) in an amount of 0.1 to 10 mass % based on the mass of the cation-polymerizable organic compound (A) and a radical polymerization initiator (D) in an amount of 0.1 to 10 mass % based on the mass of the radical polymerizable organic compound (B).

6. The resin composition for optical stereolithography according to claim 1, which contains at least one dye selected from purple and blue dyes in an amount of 0.02 to 5 ppm based on the total mass of the resin composition for optical stereolithography.

7. A method for producing a stereolithographic product, wherein optical stereolithography is conducted using the resin composition for optical stereolithography according to claim 1.

* * * * *